United States Patent
Hao et al.

(10) Patent No.: US 11,357,083 B2
(45) Date of Patent: Jun. 7, 2022

(54) LIGHT-EMITTING SUBSTRATE AND DRIVING METHOD THEREOF, LIGHT-EMITTING MODULE, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Wei Hao, Beijing (CN); Feifei Wang, Beijing (CN); Wengang Su, Beijing (CN); Rui Shi, Beijing (CN); Lingyun Shi, Beijing (CN); Haiwei Sun, Beijing (CN); Ming Chen, Beijing (CN); Xue Dong, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/255,060

(22) PCT Filed: Mar. 5, 2020

(86) PCT No.: PCT/CN2020/077881
§ 371 (c)(1),
(2) Date: Dec. 22, 2020

(87) PCT Pub. No.: WO2021/174473
PCT Pub. Date: Sep. 10, 2021

(65) Prior Publication Data
US 2022/0053615 A1    Feb. 17, 2022

(51) Int. Cl.
*H05B 45/10* (2020.01)
*H05B 47/16* (2020.01)
(Continued)

(52) U.S. Cl.
CPC .............. *H05B 45/10* (2020.01); *H05B 47/16* (2020.01); *G02F 1/133603* (2013.01); *G02F 1/133612* (2021.01); *H01L 25/167* (2013.01)

(58) Field of Classification Search
None
See application file for complete search history.

(56) References Cited

U.S. PATENT DOCUMENTS

| 10,495,924 | B2 | 12/2019 | Notoshi et al. |
| 2011/0018912 | A1* | 1/2011 | Adachi ................ G09G 3/3413 345/690 |
| 2017/0193927 | A1 | 7/2017 | Yang et al. |

FOREIGN PATENT DOCUMENTS

| CN | 101442856 | 5/2009 |
| CN | 108957852 | 12/2018 |
| CN | 108957852 A | * 12/2018 |

* cited by examiner

*Primary Examiner* — Dedei K Hammond
(74) *Attorney, Agent, or Firm* — Dority & Manning, P.A.

(57) ABSTRACT

A light-emitting substrate and a method of driving the same, a light-emitting module, and a display apparatus are provided. The light-emitting substrate has a plurality of light-emitting areas. The light-emitting substrate includes: a base, a plurality of light-emitting components, a plurality of first power supply voltage signal lines, and a plurality of first control circuits. The plurality of light-emitting components are disposed on the base. The plurality of first power supply voltage signal lines are disposed on the base and arranged at intervals. The plurality of first control circuits are disposed on the base. One light-emitting component is located in one light-emitting area. Each of the first control circuits is coupled to a first electrode of one light-emitting component, and each of first power supply voltage signal lines is coupled to at least two first control circuits.

18 Claims, 17 Drawing Sheets

(51) Int. Cl.
*G02F 1/13* (2006.01)
*H01L 25/16* (2006.01)
*G02F 1/1335* (2006.01)
*G02F 1/13357* (2006.01)

LIGHT-EMITTING SUBSTRATE AND DRIVING METHOD THEREOF, LIGHT-EMITTING MODULE, AND DISPLAY APPARATUS

CROSS-REFERENCE TO RELATED APPLICATION

This application is a national phase entry under 35 USC 371 of International Patent Application No. PCT/CN2020/077881 filed on Mar. 5, 2020, which is incorporated herein by reference in their entirety.

TECHNICAL FIELD

The present disclosure relates to the field of display technologies, and in particularly, to a light-emitting substrate and a driving method thereof, a light-emitting module, and a display apparatus.

BACKGROUND

In the field of display technologies, an application of a high-dynamic range (HDR) image technology in display apparatus can improve image quality of display images, but put forward higher requirements on color gamut and brightness of the display apparatus as well. The mini light-emitting diode has small size and high brightness, and may be widely applied to a backlight module of a display apparatus. Moreover, it may finely adjust the backlight, so as to realize a display of images with a high dynamic range.

SUMMARY

In an aspect, a light-emitting substrate is provided. The light-emitting substrate includes a base, a plurality of light-emitting components, a plurality of first power supply voltage signal lines, and a plurality of first control circuits. The plurality of light-emitting components are disposed on the base, and one light-emitting components is located within one light-emitting area. The plurality of first power supply voltage signal lines are disposed on the base and arranged at intervals. The plurality of first control circuits are disposed on the base, each of the first control circuits is coupled to a first electrode of one light-emitting component, and each of the first power supply voltage signal lines is coupled to at least two first control circuits. The first control circuit is configured to transmit a first power supply voltage signal from the first power supply voltage signal line to a first electrode of a light-emitting component coupled to the first control circuit, so as to control an amplitude of a current flowing through the light-emitting component.

light-emitting areas are arranged in an array, and the plurality of first control circuits are arranged in an array. The light-emitting components in a same row of light-emitting areas are coupled to one first power supply voltage signal line through a row of first control circuits, or, light-emitting components in a same column of light-emitting areas are coupled to one first power supply voltage signal line through a column of first control circuits.

In some embodiments, the first control circuit is configured to receive a first light-emission signal and a first enable signal, and transmit the first power supply voltage signal to the first electrode of the light-emitting component coupled to the first control circuit according to the first light-emission signal and the first enable signal, so as to control the amplitude of the current flowing through the light-emitting component. The first control circuit includes: a processor, an analog-to-digital converter, and a first output sub-circuit. The processor is configured to receive the first light-emission signal, convert a format of the first light-emission signal, and generate a second light-emission signal. The analog-to-digital converter is configured to receive the first enable signal and generate a reference signal. The first output sub-circuit is coupled to the processor, the analog-to-digital converter, the first power supply voltage signal line, and the first electrode of the light-emitting component. The first output sub-circuit is configured to transmit the first power supply voltage signal from the first power supply voltage signal line to the first electrode of the light-emitting component according to the second light-emission signal from the processor and the reference signal from the analog-to-digital converter.

In some embodiments, the first output sub-circuit includes: a first transistor, a first resistor, a comparator, and a second transistor. A control electrode of the first transistor is coupled to the processor, and a second electrode of the first transistor is coupled to the first electrode of the light-emitting component. A first end of the first resistor is coupled to the first power supply voltage signal line. A non-inverting input terminal of the comparator is coupled to an output terminal of the analog-to-digital converter, and an inverting input terminal of the comparator is coupled to a second end of the first resistor. A control electrode of the second transistor is coupled to an output terminal of the comparator, a first electrode of the second transistor is coupled to the second end of the first resistor, and a second electrode of the second transistor is coupled to a first electrode of the first transistor.

In some embodiments, the light-emitting substrate includes a first control chip including the first control circuit. The first control chip further includes: a first interface, a second interface, a third interface, and a fourth interface. The first interface is coupled to the processor in the first control circuit, and the first interface is configured to receive the first light-emission signal, and transmit the first light-emission signal to the processor. The second interface is coupled to the analog-to-digital converter in the first control circuit, and the second interface is configured to receive the first enable signal, and transmit the first enable signal to the analog-to-digital converter. The third interface is coupled to the first power supply voltage signal line and the first output sub-circuit in the first control circuit, and the third interface is configured to receive the first power supply voltage signal from the first power supply voltage signal line, and transmit the first power supply voltage signal to the first output sub-circuit. The fourth interface is coupled to the first output sub-circuit in the first control circuit and the first electrode of the light-emitting component, and the fourth interface is configured to transmit the first power supply voltage signal passing through the first output sub-circuit to the first electrode of the light-emitting component.

In some embodiments, the light-emitting substrate further includes a second control circuit disposed on the base. The second control circuit is coupled to the plurality of first control circuits. The second control circuit is configured to receive a driving signal, and transmit the first light-emission signal and the first enable signal to each of the first control circuits according to the driving signal.

In some embodiments, the second control circuit includes: a timing control sub-circuit, a data processing sub-circuit, a memory, and an amplifier sub-circuit. The timing control sub-circuit is configured to generate a clock signal. The data processing sub-circuit is coupled to the timing control sub-circuit and the plurality of first control circuits. The data processing sub-circuit is configured to receive the driving signal, and output a second enable signal according to the driving signal and the clock signal from the timing control sub-circuit, and transmit the first light-emission signal to the plurality of first control circuits. The memory is configured to store a timing data and a light-emission current data for a preset light-emission mode. The amplifier sub-circuit is coupled to the data processing sub-circuit, the memory and the plurality of first control circuits. The amplifier sub-circuit is configured to amplify a power of the second enable signal from the data processing sub-circuit according to the timing data and the light-emission current data for the preset light-emission mode, generate the first enable signal, and transmit the first enable signal to the plurality of first control circuits.

In some embodiments, the light-emitting substrate includes a second control chip including the second control circuit. The second control chip further includes a plurality of enable signal interfaces, a plurality of light-emission signal interfaces and a driving signal interface. The plurality of enable signal interfaces are coupled to the amplifier sub-circuit in the second control circuit, and each of the enable signal interfaces is coupled to at least one of the first control circuits. The enable signal interfaces are configured to receive the first enable signal from the amplifier sub-circuit, and transmit the first enable signal to the first control circuit coupled thereto. The plurality of light-emission signal interfaces are coupled to the data processing sub-circuit in the second control circuit, and each of the light-emission signal interfaces is coupled to one of the first control circuits. The light-emission signal interfaces are configured to receive the first light-emission signal from the data processing sub-circuit, and transmit the first light-emission signal to the first control circuit coupled thereto. The driving signal interface is coupled to the data processing sub-circuit, and the driving signal interface is configured to receive the driving signal and transmit the driving signal to the data processing sub-circuit.

In some embodiments, in a case where the plurality of first control circuits are arranged in the array, each of the enable signal interfaces is coupled to a row or a column of the first control circuits.

In some embodiments, the light-emitting substrate further includes a plurality of second power supply voltage signal lines disposed on the base and arranged at intervals. Second electrodes of the light-emitting components in at least two light-emitting areas are coupled to one of the second power supply voltage signal lines.

In some embodiments, in a case where the plurality of light-emitting areas are arranged in the array, light-emitting components in a same row or a same column of the light-emitting areas are coupled to one of the second power supply voltage signal lines.

In some embodiments, the first power supply voltage signal line and the second power supply voltage signal line both extend in a column direction, or both extend in a row direction.

In some embodiments, the second power supply voltage signal line and the first power supply voltage signal line are of a same material and are disposed on a same layer.

In some embodiments, the light-emitting substrate further includes an insulating layer. In a direction perpendicular to the base, the first power supply voltage signal line and the second power supply voltage signal line are located on a side, proximate to the base, of the insulating layer, and the light-emitting component and the first control circuit are located on a side, away from the base, of the insulating layer. The insulating layer is provided with a first via and a second via, and the first control circuit is coupled to the first power supply voltage signal line through the first via; and the second electrode of the light-emitting component is coupled to the second power supply voltage signal line through the second via.

In some embodiments, in a case where the light-emitting substrate further includes the second control circuit, the light-emitting substrate further includes: a plurality of connecting leads disposed on the side, away from the base, of the insulating layer, and the plurality of connecting leads are configured to couple respective first control circuits with the second control circuits.

In some embodiments, the light-emitting component includes: a plurality of light-emitting devices and a plurality of conductive patterns. The plurality of light-emitting devices are arranged in an array. The plurality of light-emitting devices are sequentially connected in series by the plurality of conductive patterns. In a line formed by the plurality of light-emitting devices that are sequentially connected in series, a cathode of one of two light-emitting devices at both ends of the line is the first electrode of the light-emitting component, and an anode of another light-emitting device of the two light-emitting devices is the second electrode of the light-emitting component.

In another aspect, a light-emitting module is provided. The light-emitting module includes the light-emitting substrate as described in any of the above embodiments, a flexible circuit board and a power supply chip. The light-emitting substrate includes the first power supply voltage signal line and the second power supply voltage signal line. The power supply chip is bound to the light-emitting substrate through the flexible circuit board, and the power supply chip is configured to transmit the first power supply voltage signal to the first power supply voltage signal line, and transmit a second power supply voltage signal to the second power supply voltage signal line.

In yet another aspect, a display apparatus is provided. The display apparatus includes the light-emitting module in the above embodiment and a driving chip. The light-emitting substrate in the light-emitting module includes a plurality of first control circuits and a second control circuit. The driving chip is coupled to the second control circuit, and the driving chip is configured to transmit a driving signal to the second control circuit.

In yet another aspect, a driving method of the light-emitting substrate according to any one of the above embodiments is provided, and the light-emitting substrate includes a plurality of first control circuits and a second control circuit. The driving method of the light-emitting substrate includes: receiving, by the second control circuit, a driving signal, transmitting, by the second control circuit, a first light-emission signal and a first enable signal to each of the first control circuits according to the driving signal, and transmitting, by the first control circuit, the first power supply voltage signal from the first power supply voltage signal line to the first electrode of the light-emitting component coupled to the first control circuit according to the first light-emission signal and the first enable signal to control an amplitude of a current flowing through the light-emitting component.

In some embodiments, in a case where the plurality of first control circuits in the light-emitting substrate are arranged in the array, the transmitting, by the second control circuit, the first enable signal to each of the first control circuits includes: transmitting, by the second control circuit, the first enable signal to each row of the first control circuits row by row in a driving period, so as to control each row of the first control circuits to be turned on sequentially and a previous row of the first control circuits in to be turned off before a next row of the first control circuits are turned on.

In some embodiments, in a case where the plurality of first control circuits in the light-emitting substrate are arranged in the array, the transmitting, by the second control circuit, the first enable signal to each of the first control circuits includes: simultaneously transmitting, by the second control circuit, the first enable signal to each row of the first control circuits in a driving period, so as to control each row of the first control circuits to be turned on simultaneously, and each row of the first control circuits to be turned off in a current driving period before each row of the first control circuits are turned on in a next driving period.

In some embodiments, in a case where the plurality of first control circuits in the light-emitting substrate are arranged in the array, the transmitting, by the second control circuit, the first enable signal to each of the first control circuits includes: sequentially transmitting, by the second control circuit, the first enable signal to each row of the first control circuits in a driving period, so as to control each row of the first control circuits to be turned on sequentially, and each row of the first control circuits to be turned off in a current driving period before each row of the first control circuits are turned on in a next driving period.

In some embodiments, in a case where the first control circuit includes the processor, the analog-to-digital converter, and the first output sub-circuit, the transmitting, by the first control circuit, the first power supply voltage signal from the first power supply voltage signal line to the first electrode of the light-emitting component coupled to the first control circuit according to the first light-emission signal and the first enable signal includes: the processor receiving the first light-emission signal, converting the format of the first light-emission signal, and generating a second light-emission signal; the analog-to-digital converter receiving the first enable signal and generating a reference signal; and the first output sub-circuit transmitting the first power supply voltage signal from the first power supply voltage signal line to the first electrode of the light-emitting component according to the second light-emission signal and the reference signal.

In some embodiments, in a case where the second control circuit includes the timing control sub-circuit, the data processing sub-circuit, the memory, and the amplifier sub-circuit, the receiving the driving signal and transmitting the first light-emission signal and the first enable signal to each of the first control circuits according to the driving signal by the second control circuit includes: the timing control sub-circuit generating the clock signal; the data processing sub-circuit receiving the driving signal, outputting the second enable signal according to the driving signal and the clock signal from the timing control sub-circuit, and transmitting the first light-emission signal to the plurality of first control circuits; the memory storing the timing data and the light-emission current data for the preset light-emission mode; and the amplifier sub-circuit amplifying the power of the second enable signal from the data processing sub-circuit according to the timing data and the light-emission current data for the preset light-emission mode from the memory, generating the first enable signal, and transmitting the first enable signal to the plurality of first control circuits.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
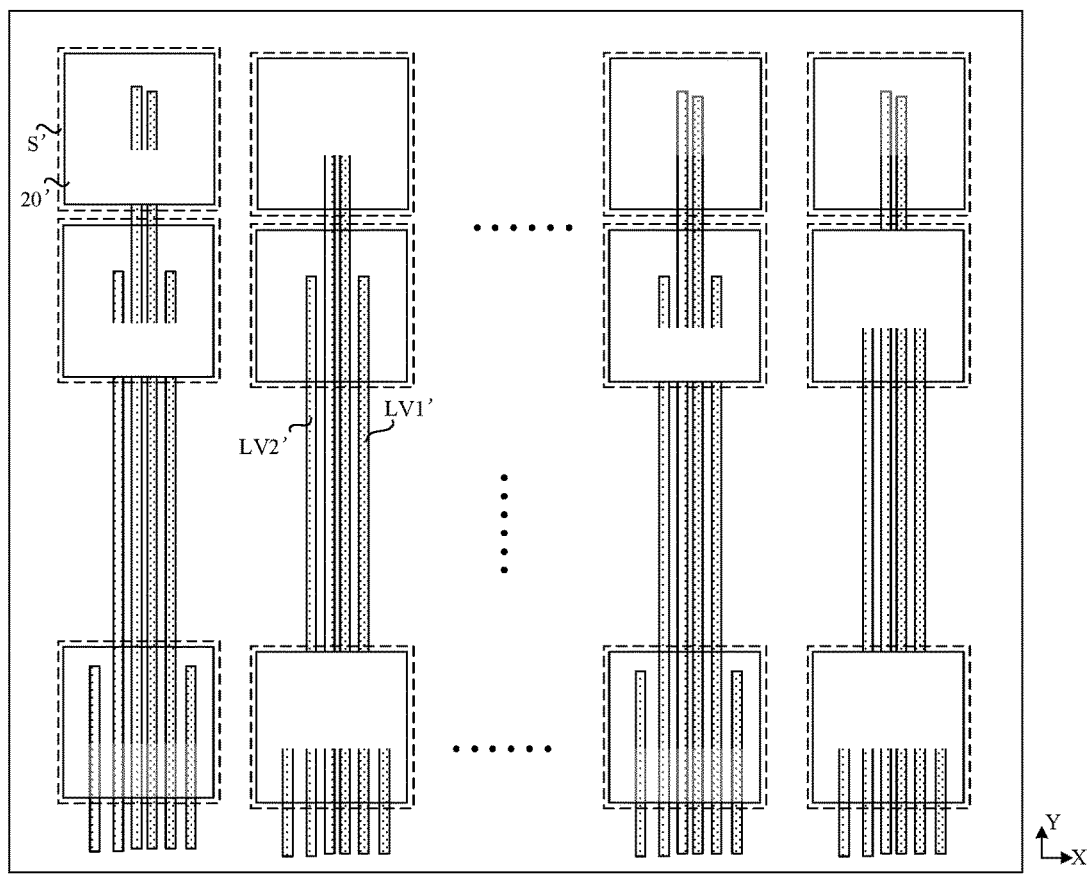
FIG. 1 is a diagram showing a structure of a light-emitting substrate, according to some embodiments of the related art.

Technical solutions in some embodiments of the present disclosure will be described below clearly and completely with reference to the drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed in an open and inclusive sense, i.e., "include, but not limited to". In the description, the terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying a relative importance or implicitly indicating the number of indicated technical features below. Thus, features defined with "first" and "second" may explicitly or implicitly include one or more of the features. In the description of the embodiments of the present disclosure, the term "a plurality of" means two or more unless otherwise specified.

In the description of some embodiments, the terms such as "coupled" and "connected" and their extensions may be used. For example, some embodiments may be described using the term "connected" to indicate that two or more elements are in direct physical contact or electrical contact with each other. For another example, term "coupled" may be used in the description of some embodiments to indicate that two or more components are in direct physical or electrical contact. However, the term "coupled" or "communicatively coupled" may also mean that two or more elements are not in direct contact with each other, but still cooperate or interact with each other. The embodiments disclosed herein are not necessarily limited to the content herein.

"At least one of A, B, and C" has a same meaning as "at least one of A, B, or C", and both include the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

In the related art, as shown in FIG. 1, a light-emitting substrate 100' includes a plurality of light-emitting components 20'. Each light-emitting component 20' is coupled to one first power supply voltage signal line LV1' and one second power supply voltage signal line LV2'. The first power supply voltage signal line LV1' and the second power supply voltage signal line LV2' respectively transmit a first power supply voltage signal and a second power supply voltage signal to the light-emitting component 20', so as to control an amplitude of a current flowing through the light-emitting component 20'. The first power supply voltage signal line LV1' and the second power supply voltage signal line LV2' need to be led out to a surface of a peripheral region of the light-emitting substrate 100' through vias, and then are bound to an external driving circuit through a flexible circuit board. In a case where the light-emitting substrate 100' is of a hard material (such as glass), it is difficult to form a via and requires a high production process precision. The number of traces on the light-emitting substrate 100' is large. Limited by a limit distance between gold fingers on the flexible circuit board and a size of the flexible circuit board, the light-emitting substrate 100' needs to be connected to a plurality of flexible circuit boards to meet the requirements, which results in a higher production cost.

Figure 2:
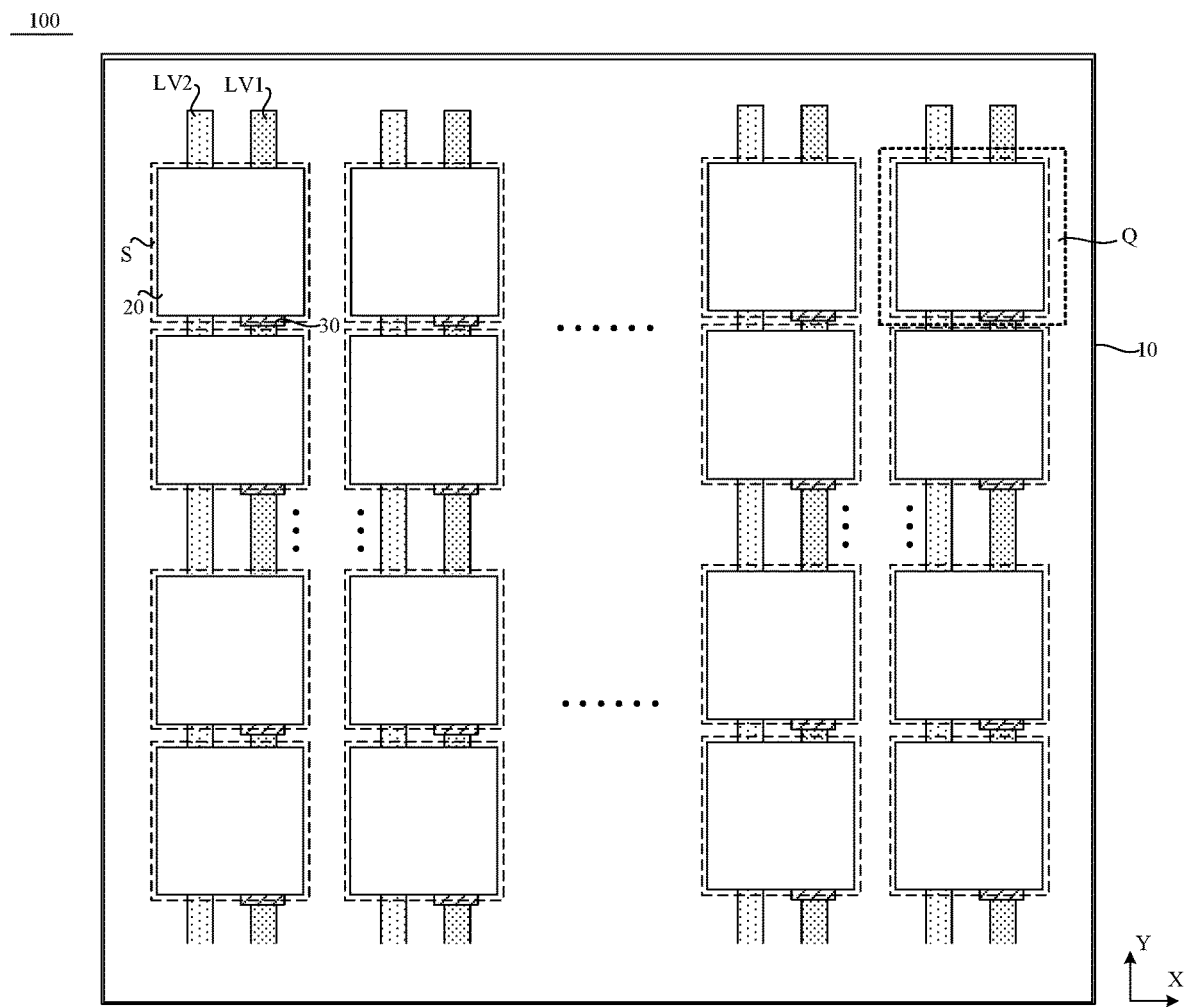
FIG. 2 is a diagram showing a structure of a light-emitting substrate, according to some embodiments of the disclosure.

Some embodiments of the present disclosure provide a light-emitting substrate 100. As shown in FIG. 2, the light-emitting substrate 100 includes a plurality of light-emitting areas S. The light-emitting substrate 100 includes a base 10, a plurality of light-emitting components 20, a plurality of first power supply voltage signal lines LV1, and a plurality of first control circuits 30.

The plurality of light-emitting components 20 are disposed on the base 10, and one light-emitting component 20 is located within one light-emitting area S.

The plurality of first power supply voltage signal lines LV1 are disposed on the base 10 and arranged at intervals.

The plurality of first control circuits 30 are disposed on the base 10, each of the first control circuits 30 is coupled to a first electrode of one light-emitting component 20, and each of the first power supply voltage signal lines LV1 is coupled to at least two first control circuits 30.

The first control circuit 30 is configured to transmit a first power supply voltage signal from the first power supply voltage signal line LV1 to the first electrode of the light-emitting component 20 coupled to the first control circuit 30, so as to control an amplitude of a current flowing through the light-emitting component 20.

For example, the first power supply voltage signal is a direct current low voltage signal.

On this basis, each of the first control circuits 30 in the light-emitting substrate 100 is coupled to the first electrode of one light-emitting component 20, and each first power supply voltage signal line LV1 is coupled to at least two first control circuits 30, which reduces the number of signal lines (for example, the first power supply voltage signal lines LV1) on the light-emitting substrate 100 and a voltage drop on the signal line, and improves a stability of the signal. Moreover, the first control circuit 30 transmits the first power supply voltage signal to a first electrode of a light-emitting component 20 coupled to the first control circuit 30, and the first power supply voltage signal determines the amplitude of the current transmitted to the light-emitting component 20. Meanwhile, the first control circuit 30 may control a duration for which the first power supply voltage signal is transmitted to the light-emitting component 20; and the amplitude of the current and the duration together determine a light-emitting brightness of the light-emitting component 20.

Therefore, in the light-emitting substrate 100 provided in the embodiments of the present disclosure, each of the first control circuits 30 is coupled to the first electrode of the light-emitting component 20, each of the first power supply voltage signal lines LV1 is coupled to at least two first control circuits 30, and the first control circuit 30 transmits the first power supply voltage signal from the first power supply voltage signal line LV1 to the first electrode of the light-emitting component 20 coupled to the first control circuit 30, so as to control the amplitude of the current flowing through the light-emitting component 20 and the duration.

In this way, the first control circuit 30 controls the duration for which the first power supply voltage signal is transmitted to the light-emitting component 20, and the first power supply voltage signal determines the amplitude of the current transmitted to the light-emitting component 20, so that the light-emitting brightness of the light-emitting component 20 can be controlled jointly by the amplitude of the current and the duration. In addition, compared to one first power supply voltage signal line LV1 being coupled to one light-emitting component 20, the number of the signal lines (for example, the first power supply voltage signal lines LV1) of the light-emitting substrate 100 is reduced, which simplifies a wiring design of the light-emitting substrate 100. Since the number of the signal lines is reduced, a spacing between the signal lines is increased. As a result, a width of the signal line may be appropriately increased with a thickness of the signal line reduced, so that an impedance of the signal line and thus the voltage drop on the signal line are reduced, which improves the stability of the signal. In a case where, for example, a flexible circuit board is used to bind the external driving circuit to the light-emitting substrate 100, since the number of the wires is reduced, the number of flexible circuit boards may be reduced accordingly, so that the production cost is reduced.

In some embodiments, as shown in FIG. 2, the plurality of light-emitting areas S are arranged in an array, and the plurality of first control circuits 30 are arranged in an array.

For example, as shown in FIG. 2, light-emitting areas S arranged in a row in a horizontal direction X are referred to as a row of light-emitting areas, and light-emitting areas S arranged in a row in a vertical direction Y are referred to as a column of light-emitting areas. First control circuits 30 arranged in a row in the horizontal direction X are referred to as a row of first control circuits, and first control circuits 30 arranged in a row in the vertical direction Y are referred to as a column of first control circuits.

Figure 3:
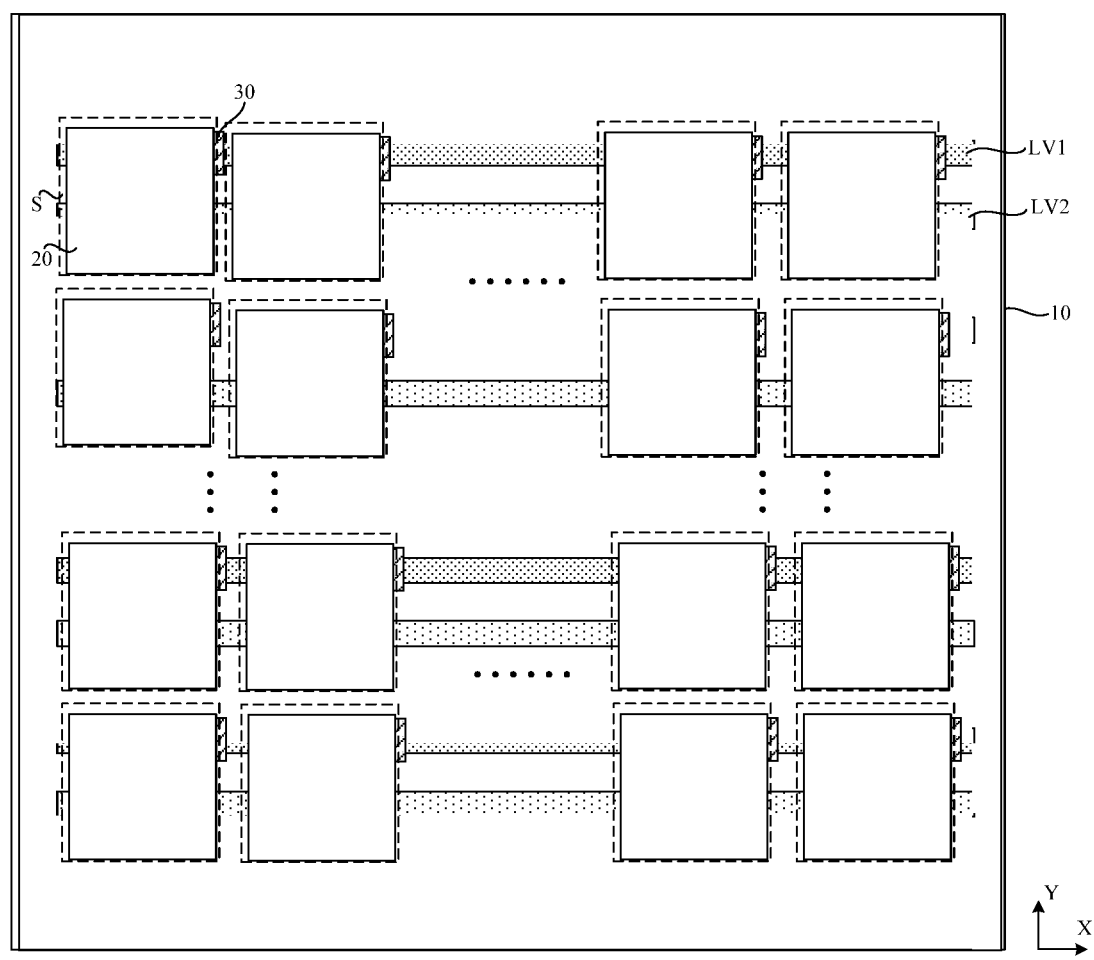
FIG. 3 is a diagram showing another structure of a light-emitting substrate, according to some embodiments of the disclosure.

As shown in FIG. 3, the light-emitting components 20 in a same row of the light-emitting areas S are coupled to one first power supply voltage signal line LV1 through a row of first control circuits 30, or, as shown in FIG. 2, the light-emitting components 20 in a same column of the light-emitting areas S are coupled to one first power supply voltage signal line LV1 through a column of first control circuits 30.

For example, the light-emitting substrate 100 includes light-emitting areas S arranged in n rows and m columns and first control circuits 30 arranged in n rows and m columns, in which n and m are both positive integers. One light-emitting area S corresponds to one first control circuit 30. In a case where the light-emitting components 20 in a same row of light-emitting areas S are coupled to one first power supply voltage signal line LV1 through a row of first control circuits 30, the first power supply voltage signal line LV1 extends in the row direction (i.e., the horizontal direction X in FIG. 3), and in this case, the number of the first power supply voltage signal lines LV1 is n. In a case where the light-emitting components 20 in a same column of light-emitting areas S are coupled to one first power supply voltage signal line LV1 through a column of first control circuits 30, the first power supply voltage signal line LV1 extends in the column direction (i.e., the vertical direction Y in FIG. 2), and in this case the number of the first power supply voltage signal lines LV1 is m.

Therefore, compared to the light-emitting substrate 100' shown in FIG. 1 where one first power supply voltage signal line LV1' is coupled to light-emitting components 20' in one light-emitting area S' and the number of the first power supply voltage signal lines LV1' is (n×m), the number of the first power supply voltage signal lines LV1 in the light-emitting substrate 100 in the embodiments of the present disclosure is reduced. For example, in a case where the first power supply voltage signal line LV1 extends in the row direction, the number of the first power supply voltage signal line LV1 is n; and in a case where the first power supply voltage signal line LV1 extends in the column direction, the number of the first power supply voltage signal lines LV1 is m, which reduces the number of the signal lines of the light-emitting substrate 100, and simplifies the wiring design of the light-emitting substrate 100. Since the number of the signal lines is reduced, a design spacing between the signal lines may be relatively increased. Therefore, the width of the signal line may be appropriately increased to reduce the impedance of the signal line and the voltage drop on the signal line, which improves the stability of the signal.

Figure 4:
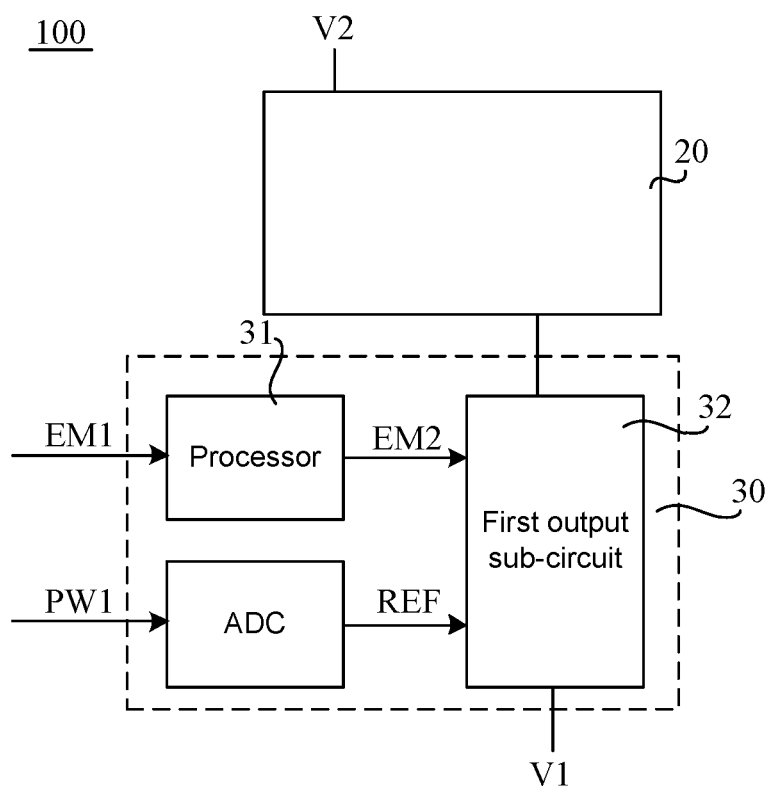
FIG. 4 is a diagram showing a structure of a first control circuit, according to some embodiments of the disclosure.

In some embodiments, referring to FIG. 4, the first control circuit 30 is configured to receive a first light-emission signal EM1 and a first enable signal PW1, and transmit a first powers supply voltage signal V1 to the first electrode of the light-emitting component 20 coupled to the first control circuit 30 according to the first light-emission signal EM1 and the first enable signal PW1, so as to control the amplitude of the current flowing through the light-emitting component 20.

It will be noted that, referring to FIG. 4, V1 represents the first power supply voltage signal from the first power supply voltage signal line LV1.

The first light-emission signal EM1 received by the first control circuit 30 is a light-emission data for the light-emitting component 20 coupled to the first control circuit 30. For example, the first light-emission signal EM1 includes a pulse width modulation (PWM) signal. The first enable signal PW1 received by the first control circuit 30 is a signal for driving the first control circuit 30 to be turned on. For example, the first enable signal PW1 includes a power signal.

As shown in FIG. 4, the first control circuit 30 includes: a processor 31, an analog-to-digital converter ADC and a first output sub-circuit 32.

The processor 31 is configured to receive the first light-emission signal EM1 and convert a format of the first light-emission signal EM1 to generate a second light-emission signal EM2.

It will be noted that, the processor 31 converts the first light-emission signal EM1 into the second light-emission signal EM2 to match a format of a signal required for an operation of the first control circuit 30. A specific conversion manner is not limited here, which can be set by a person skilled in the art according to actual product requirements. For example, the first light-emission signal EM1 and the second light-emission signal EM2 may both be PWM signals with different formats.

The analog-to-digital converter ADC is configured to receive the first enable signal PW1 and generate a reference signal REF.

It can be understood that, the first enable signal PW1 is an analog signal, and the reference signal REF is a digital signal. The analog-to-digital converter ADC generates reference signals REF with different potentials according to received first enable signals PW1 with different potentials.

The first output sub-circuit 32 is configured to transmit the first power supply voltage signal V1 from the first power supply voltage signal line LV1 to the first electrode of the light-emitting component 20 according to the second light-emission signal EM2 from the processor 31 and the reference signal REF from the analog-to-digital converter ADC.

Potentials of the second light-emission signal EM2 generated by respective first control circuits 30 are not completely the same as those of the reference signal REF. In this case, the first output sub-circuit 32 is turned on under a control of the second light-emission signal EM2 and the reference signal REF, and transmits the first power supply voltage signal to the first electrode of the light-emitting component 20. By adjusting the potential of the second light-emission signal EM2, turning-on duration of respective first control circuits 30 are not completely the same, so that a duration for which the first power supply voltage signal V1 is transmitted to the first electrode of the light-emitting component 20 can be adjusted and an operating time of the light-emitting component 20 can be controlled. By adjusting the potential of the reference signal REF, the amplitude of the current flowing through the light-emitting component 20 can be controlled.

It will be noted that, when the light-emitting substrate 100 is applied to a display apparatus, potentials of first enable signals PW1 received by respective first control circuits 30 may be the same or may be different. In a case where the potentials of the first enable signals PW1 received by respective first control circuits 30 are the same, the reference signals REF generated by respective first control circuits 30 are the same. The duration for which the first power supply voltage signal V1 is transmitted to the first electrode of the light-emitting component 20 may be adjusted according to the received different first light-emission signals EM1. In a case where the potentials of the first enable signals PW1 received by respective first control circuits 30 are different, the reference signals REF generated by respective first control circuits 30 are different, so that the amplitude of the current flowing through the light-emitting component 20 may be adjusted. Therefore, the brightness of the light-emitting component 20 in the light-emitting area S is adjusted by controlling the amplitude of the current flowing through the light-emitting component 20 and the duration according to the received first enable signal PW1 and the first light-emission signal EM1.

Figure 5:
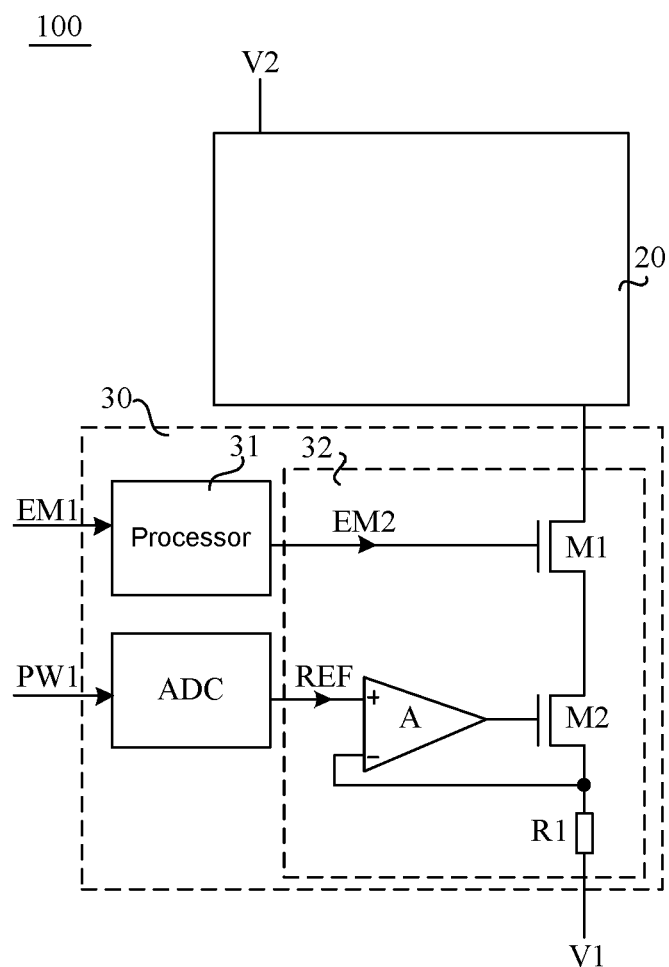
FIG. 5 is a diagram showing yet another structure of a light-emitting substrate, according to some embodiments of the disclosure.

For example, as shown in FIG. 5, the first output sub-circuit 32 includes: a first transistor M1, a first resistor R1, a comparator A, and a second transistor M2.

A control electrode of the first transistor M1 is coupled to the processor 31, and a second electrode of the first transistor M1 is coupled to the first electrode of the light-emitting component 20.

A first end of the first resistor R1 is coupled to the first power supply voltage signal line LV1.

A non-inverting input terminal of the comparator A is coupled to an output terminal of the analog-to-digital converter ADC, and an inverting input terminal of the comparator A is coupled to a second end of the first resistor R1.

A control electrode of the second transistor M2 is coupled to an output terminal of the comparator A, a first electrode of the second transistor M2 is coupled to the second end of the first resistor R1, and a second electrode of the second transistor M2 is coupled to the first electrode of the first transistor M1.

In this case, the comparator A compares the first power supply voltage signal V1 transmitted through the first resistor R1 with the reference signal REF from the analog-to-digital converter ADC, and transmits the compared signal to the second transistor M2 to control a turning-on of the second transistor M2. Since potentials of the first enable signals PW1 received by the first control circuits 30 coupled to different light-emitting components 20 are not completely the same, potentials of the reference signals REF generated according to the first enable signals PW1 are not completely the same. As a result, the reference signals REF whose potentials are not completely the same may be generated by adjusting the potentials of the first enable signals PW1 so as to control the amplitude of the current flowing through the second transistor M2, and control the amplitude of the current flowing through the light-emitting component 20.

In addition, the processor 31 converts the format of the first light-emission signal EM1 to generate the second light-emission signal EM2, and the first transistor M1 is turned on under a control of the second light-emission signal EM2. Since the potentials of the first light-emission signals EM1 corresponding to different light-emitting components 20 are not completely the same, and the potentials of the second light-emission signals EM2 are not completely the same either, a turning-on duration of the first transistor M1 in each first control circuit 30 may be controlled by adjusting the potentials of the first light-emission signals EM1 to generate the second light-emission signals EM2 with potentials which are not completely the same, so as to control the duration for which the first power supply voltage signal V1 is transmitted to the first electrode of the light-emitting component 20 through the first output sub-circuit 32.

It will be noted that, the transistors may be thin film transistors, field-effect transistors or other switching devices with same characteristics, which is not limited in the embodiments of the present disclosure. The control electrode of the transistor is a gate of the transistor, the first electrode is one of a source and a drain of the transistor, and the second electrode is another one of the source and the drain of the transistor. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

Figure 6:
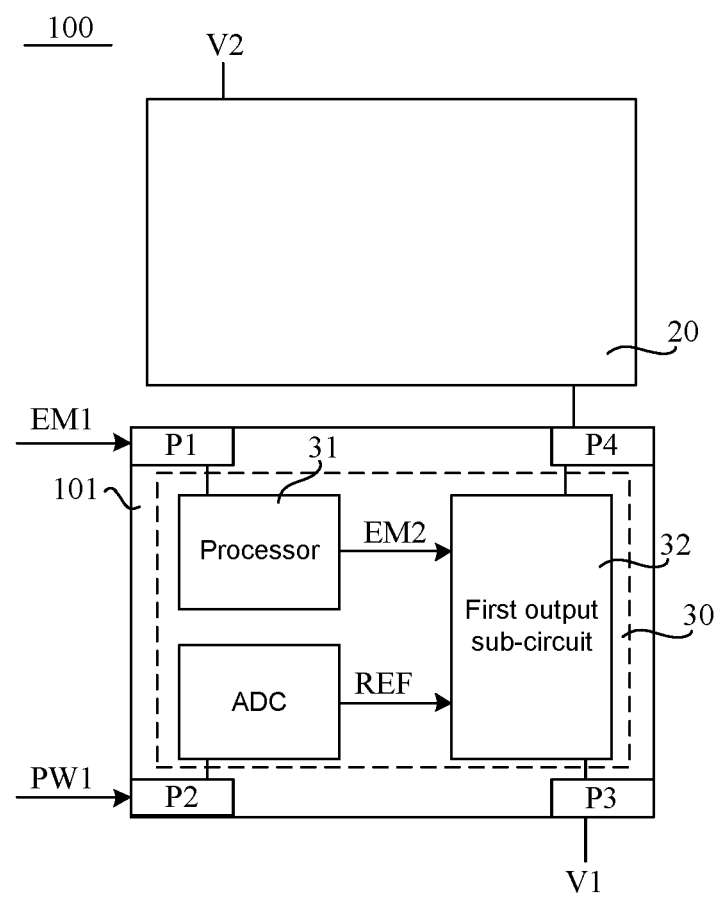
FIG. 6 is a diagram showing yet another structure of a light-emitting substrate, according to some embodiments of the disclosure.

In some embodiments, as shown in FIG. 6, the light-emitting substrate 100 includes a first control chip 101. The first control chip 101 includes the first control circuit 30.

The first control chip 101 further includes: a first interface P1, a second interface P2, a third interface P3, and a fourth interface P4.

The first interface P1 is coupled to the processor 31 in the first control circuit 30.

The second interface P2 is coupled to the analog-to-digital converter ADC in the first control circuit 30.

The third interface P3 is coupled to the first power supply voltage signal line LV1 and the first output sub-circuit 32 in the first control circuit 30.

The fourth interface P4 is coupled to the first output sub-circuit 32 in the first control circuit 30 and the first electrode of the light-emitting component 20.

The first interface P1 is configured to receive the first light-emission signal EM1 and transmit the first light-emission signal EM1 to the processor 31.

The second interface P2 is configured to receive the first enable signal PW1 and transmit the first enable signal PW1 to the analog-to-digital converter ADC.

The third interface P3 is configured to receive the first power supply voltage signal V1 from the first power supply voltage signal line LV1 and transmit the first power supply voltage signal to the first output sub-circuit 32.

The fourth interface P4 is configured to transmit the first power supply voltage signal transmitted through the first output sub-circuit 32 to the first electrode of the light-emitting component 20.

In this case, the first control chip 101 controls the duration for which the first power supply voltage signal V1 is transmitted to a light-emitting component 20 coupled thereto according to the received first light-emission signal EM1 and the first enable signal PW1, so as to control the amplitude of the current flowing through the light-emitting component 20 coupled to the first control chip 101 and the duration. In addition, the number of interfaces of the first control chip 101 is small, and a size of the first control chip 101 is in an order of micrometer, which causes the first control chip 101 to have a small effect on an area of an effective light-emitting region in the light-emitting substrate 100.

Figure 7:
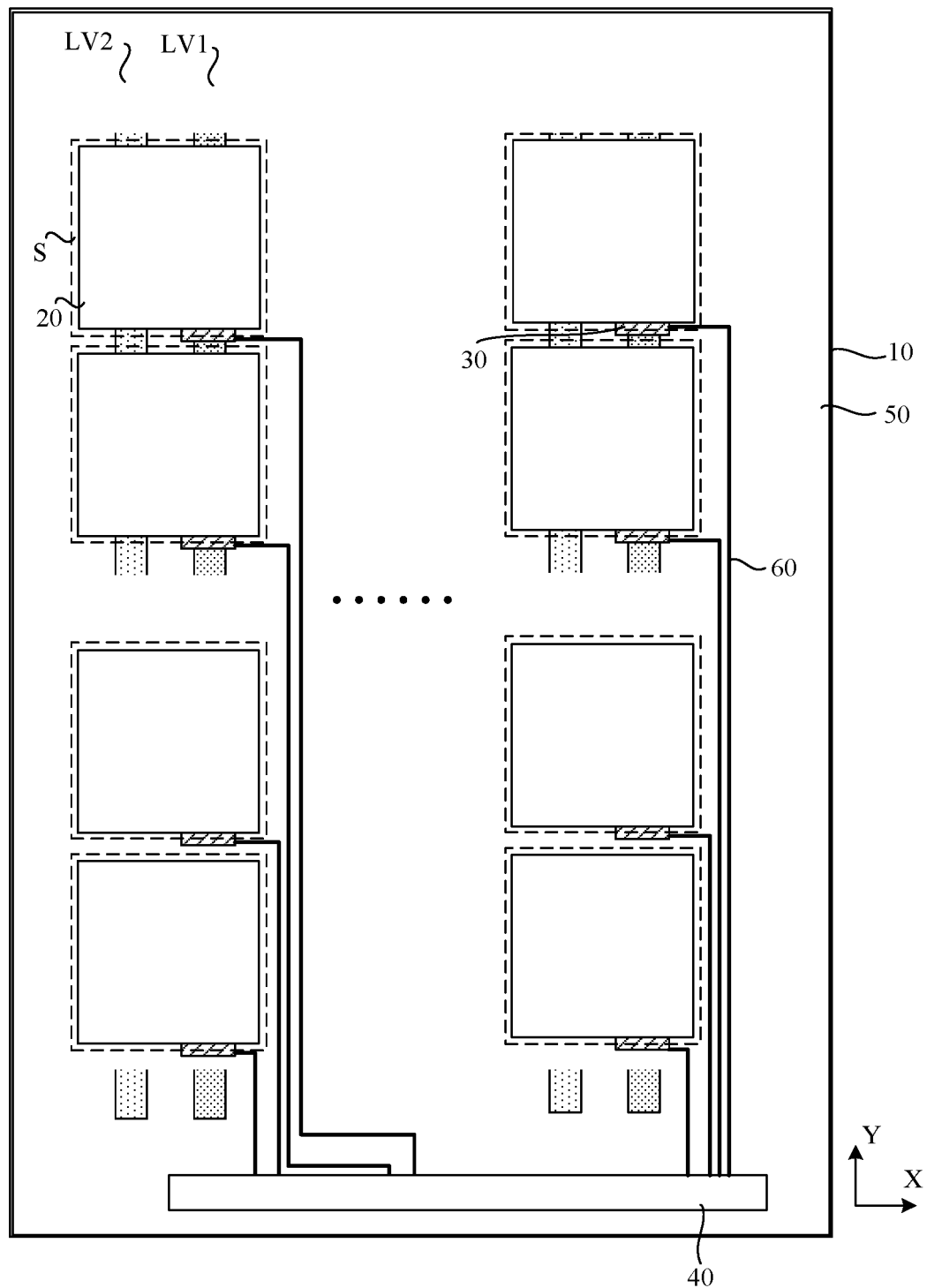
FIG. 7 is a diagram showing yet another structure of a light-emitting substrate, according to some embodiments of the disclosure.

In some embodiments, as shown in FIG. 7, the light-emitting substrate 100 further includes a second control circuit 40 disposed on the base 10. The second control circuit 40 is coupled to the plurality of first control circuits 30.

The second control circuit 40 is configured to receive a driving signal, and transmit the first light-emission signal EM1 and the first enable signal PW1 to each first control circuit 30 according to the driving signal.

Figure 8:
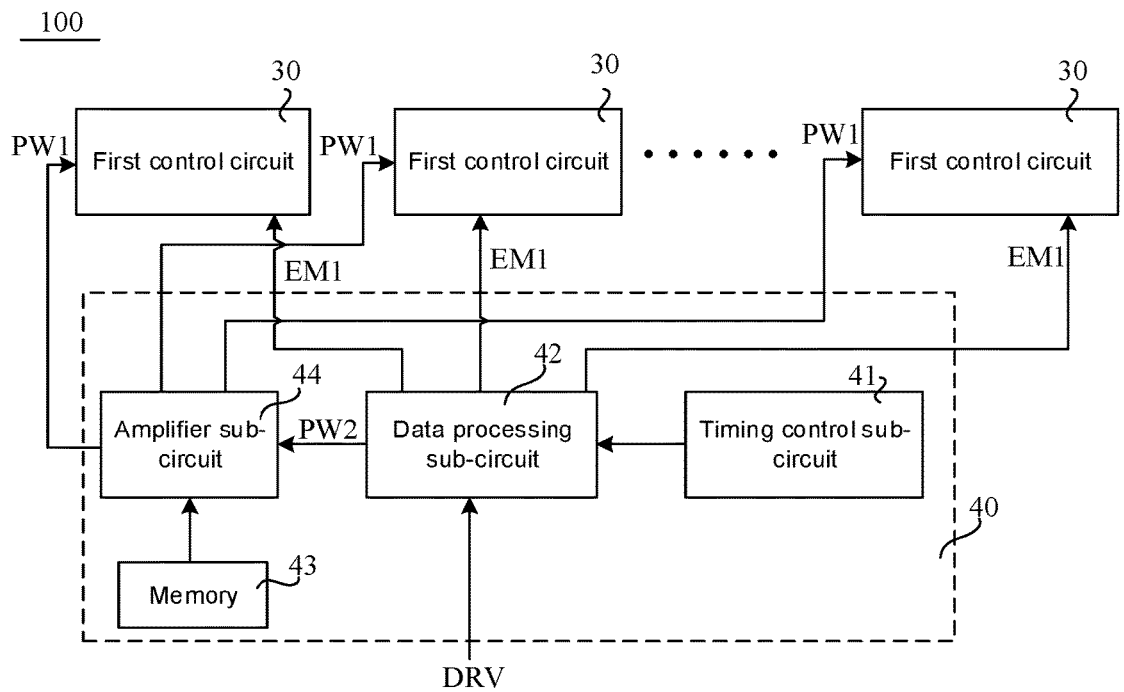
FIG. 8 is a diagram showing yet another structure of a light-emitting substrate, according to some embodiments of the disclosure.

In some embodiments, as shown in FIG. 8, the second control circuit 40 includes: a timing control sub-circuit 41, a data processing sub-circuit 42, a memory 43, and an amplifier sub-circuit 44.

The data processing sub-circuit 42 is coupled to the timing control sub-circuit 41 and the plurality of first control circuits 30.

The amplifier sub-circuit 44 is coupled to the data processing sub-circuit 42, the memory 43 and the plurality of first control circuits 30.

The timing control sub-circuit 41 is configured to generate a clock signal.

The data processing sub-circuit 42 is configured to receive a driving signal DRV, output a second enable signal PW2 according to the driving signal DRV and a clock signal from the timing control sub-circuit 41, and transmit the first light-emission signal EM1 to the plurality of first control circuits 30.

The memory 43 is configured to store a timing data and light-emission current data for a preset light-emission mode.

t will be noted that, in the case where the light-emitting substrate 100 is applied to the display apparatus, a person skilled in the art may set a light-emission mode of the light-emitting substrate 100 according to a display mode of the display apparatus, and store the timing data and light-emission current data for the preset light-emission mode.

The amplifier sub-circuit 44 is configured to amplify a power of the second enable signal PW2 from the data processing sub-circuit 42 according to the timing data and the light-emission current data for the preset light-emission mode, generate the first enable signal PW1, and transmit the first enable signal PW1 to the plurality of first control circuits 30.

In this case, when the second control circuit 40 starts to operate, the timing control sub-circuit 41 generates the clock signal, and the data processing sub-circuit 42 transmits the first light-emission signal EM1 to the plurality of first control circuits 30 according to the clock signal and the received driving signal DRV, and transmits the second enable signal PW2 to the amplifier sub-circuit 44. The amplifier sub-circuit 44 amplifies the power of the second enable signal PW2 according to the timing data and the light-emission current data for the preset lighting mode stored in the memory 43, generates the first enable signal PW1, transmits the first enable signal PW1 to the plurality of first control circuits 30, and controls the magnitude of the current of the first control circuit 30 to drive the plurality of first control circuits 30 to operate, so as to realize a control of a operation state of the light-emitting component 20 coupled to the first control circuit 30. In addition, the amplifier sub-circuit 44 amplifies the power of the second enable signal PW2, which may improve a loading capacity of a second control chip 102.

Figure 9:
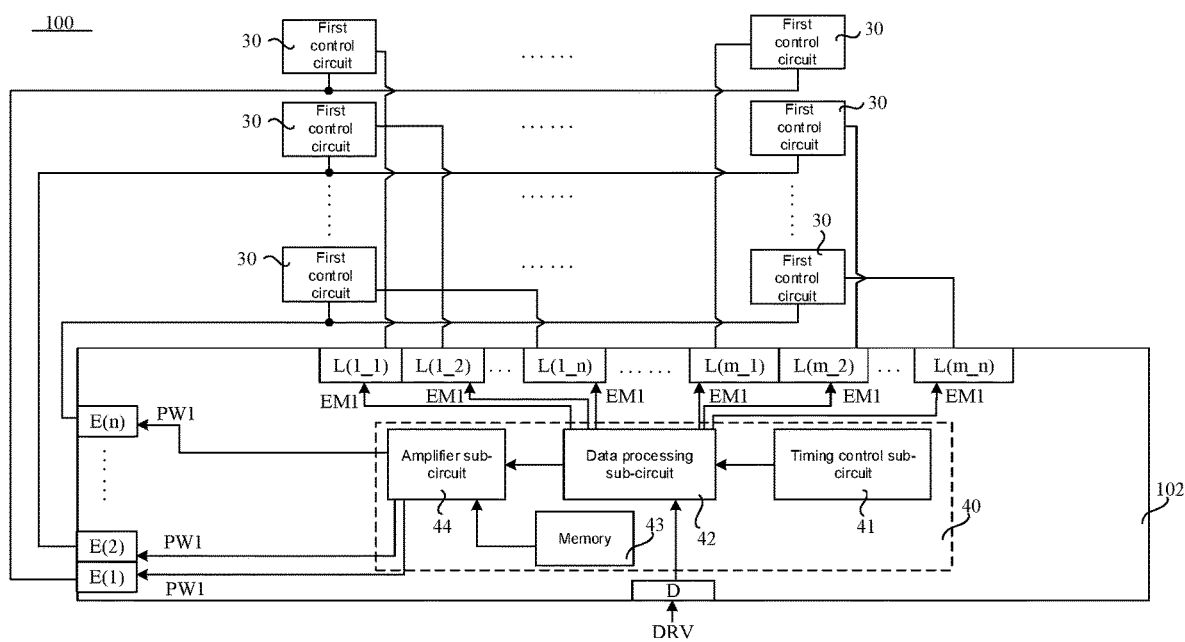
FIG. 9 is a diagram showing yet another structure of a light-emitting substrate, according to some embodiments of the disclosure.

In some embodiments, the light-emitting substrate 100 includes the second control chip 102. As shown in FIG. 9, the second control chip 102 includes the second control circuit 40.

The second control chip 102 further includes: a plurality of enable signal interfaces E, a plurality of light-emission signal interfaces L, and a driving signal interface D.

The plurality of enable signal interfaces E are coupled to the amplifier sub-circuit 44 in the second control circuit 40, and each enable signal interface E is coupled to at least one first control circuit 30.

The plurality of light-emission signal interfaces L are coupled to the data processing sub-circuit 42 in the second control circuit 40, and each light-emission signal interface L is coupled to one first control circuit 30.

For example, in a case where the light-emitting substrate 100 includes the first control circuits 30 arranged in n rows and m columns, as shown in FIG. 9, the first control circuit 30 in the first row and the first column is coupled to the light-emission signal interface L(1_1), the first control circuit 30 in the second row and the first column is coupled to the light-emission signal interface L(1_2), the first control circuit 30 in the n-th row and the first column is coupled to the light-emission signal interface L(1_n), the first control circuit 30 in the first row and the m-th column is coupled to the light-emission signal interface L(m_1), the first control circuit 30 in the second row and the m-th column is coupled to the light-emission signal interface L(m_2), and the first control circuit 30 in the n-th row and the m-th column is coupled to the light-emission signal interface L(m_n).

The driving signal interface D is coupled to the data processing sub-circuit 42.

The enable signal interface E is configured to receive the first enable signal PW1 from the amplifier sub-circuit 44, and transmit the first enable signal PW1 to the first control circuit 30 coupled thereto.

The light-emission signal interface L is configured to receive the first light-emission signal EM1 from the data processing sub-circuit 42, and transmit the first light-emission signal EM1 to the first control circuit 30 coupled thereto.

The driving signal interface D is configured to receive the driving signal DRV and transmit the driving signal DRV to the data processing sub-circuit 42.

Figure 10:
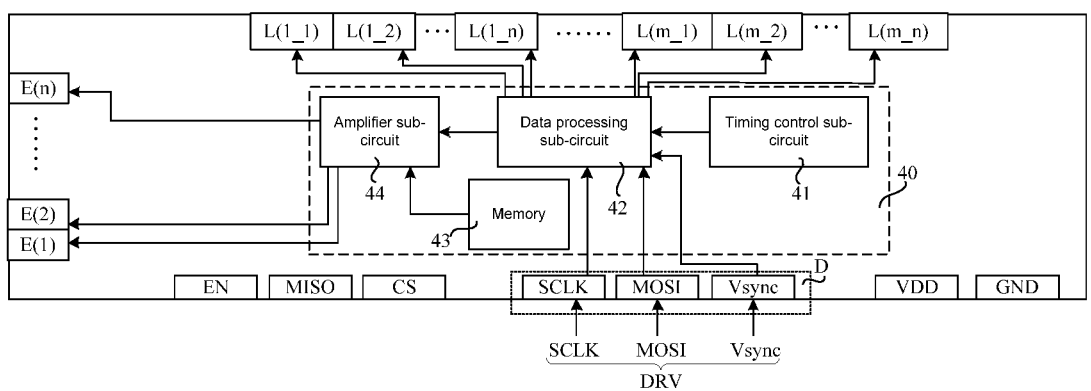
FIG. 10 is a diagram showing a structure of a second control chip, according to some embodiments of the disclosure.

The driving signal interface D may be a serial peripheral interface (SPI). As shown in FIG. 10, the driving signal interface D includes a serial clock (SCLK) interface for receiving a serial clock signal generated by a master device, a master output/slave input (MOSI) interface for receiving a data signal transmitted by the master device, and a vertical frame synchronization signal interface Vsync for receiving a vertical frame synchronization signal transmitted by the master device. That is, the driving signal DRV received by the driving signal interface D includes the SCLK signal, the MOSI signal, and the vertical frame synchronization signal Vsync. For example, in a case where the light-emitting substrate 100 is used in a display apparatus, the master device is the display apparatus, and a slave device is the second control chip 102. The driving signal received by the driving signal interface D may be from a System on chip (SOC) or a timing controller (T-con) in the display apparatus.

In addition, as shown in FIG. 10, the second control chip 102 further includes a control signal interface EN, a master input/slave output (MISO) interface, and a chip select (CS) interface. The control signal interface EN is used to receive the control signal from the master device to control the second control chip 102 to start operating. For example, when the signal received by the control signal interface EN is of a high level, the second control chip 102 starts to operate, and when the signal received by the control signal interface EN is of a low level, the second control chip 102 stops working. The MISO interface is used to transmit data from the second control chip 102 to the master device. A signal received by the CS interface is used to drive the second control chip 102 to start transmitting data. For example, when the signal received by the CS interface is active low, the second control chip 102 performs a data transmission.

In some embodiments, in a case where the plurality of first control circuits 30 are arranged in the array, each of the enable signal interfaces E is coupled to a row or a column of first control circuits 30.

It can be understood that, in a case where each of the enable signal interfaces E is coupled to a row of first control circuits 30, the signal output by each of the enable signal interfaces E may control operations of the row of the first control circuits 30; and in a case where each of the enable signal interfaces E is coupled to a column of first control circuits 30, the signal output by each of the enable signal interfaces E may control operations of the column of the first control circuits 30.

For example, in a case where the light-emitting substrate 100 includes the first control circuit 30 arranged in n rows and m columns, one enable signal interface E may be coupled to a row of first control circuits 30. As shown in FIG. 9, the first control circuits in the first row are coupled to the enable signal interface E(1), the first control circuits in the second row are coupled to the enable signal interface E(2), and the first control circuits in the n-th row are coupled to the enable signal interface E(n).

In some embodiments, as shown in FIG. 2, the light-emitting substrate 100 further includes a plurality of second power supply voltage signal lines LV2. The plurality of second power supply voltage signal lines LV2 are disposed on the base 10 and arranged at intervals.

Second electrodes of light-emitting components 20 in at least two light-emitting areas S are coupled to one second power supply voltage signal line LV2.

The second power supply voltage signal line LV2 is configured to transmit the second power supply voltage signal to the second electrode of the light-emitting component 20 coupled thereto.

It will be noted that, referring to FIG. 4, V2 represents the second power supply voltage signal from the second power supply voltage signal line LV2.

For example, the second power supply voltage signal V2 is a direct current high voltage signal.

In this case, since the second power supply voltage signal V2 is transmitted to the second electrode of the light-emitting component 20, and the first power supply voltage signal V1 is transmitted to the first electrode of the light-emitting component 20 through the first control circuit 30, a operating duration of the light-emitting component 20 can be controlled by controlling a duration for which the first power supply voltage signal V1 is transmitted to the light-emitting component 20 by the first control circuit 30. In addition, the second electrodes of the light-emitting components 20 in at least two light-emitting areas S in the light-emitting substrate 100 are coupled to one second power supply voltage signal line LV2, so that the number of second power supply voltage signal lines LV2 is reduced, and a wiring design of the light-emitting substrate 100 is simplified. Since the number of the signal lines is reduced, a spacing between the signal lines is relatively increased. Therefore, the width of the signal line may be appropriately increased to reduce the impedance of the signal line and the voltage drop on the signal line, which improves the stability of the signal. In a case where the flexible circuit board is used to bind the light-emitting substrate 100 to the external driving circuit, since the number of the wires is reduced, the number of the flexible circuit boards is also reduced accordingly, so that the production cost is reduced.

In some embodiments, in a case where a plurality of light-emitting areas S are arranged in the array, light-emitting components 20 in a same row or a same column of the light-emitting area are coupled to one second power supply voltage signal line LV2.

For example, the light-emitting substrate 100 includes light-emitting areas S arranged in n rows and m columns and first control circuits 30 arranged in n rows and m columns. As shown in FIG. 3, in a case where the light-emitting components 20 in a same row of light-emitting areas S are coupled to one second power supply voltage signal line LV2, the second power supply voltage signal line LV2 extends in the row direction (the horizontal direction X shown in FIG. 3), and in this case, the number of the second power supply voltage signal lines LV2 is n. As shown in FIG. 2, in a case where the light-emitting components 20 in a same column of light-emitting areas S are coupled to one second power supply voltage signal line LV2, the second power supply voltage signal line LV2 extends in the column direction (the vertical direction Y shown in FIG. 2), and in this case, the number of the second power supply voltage signal lines LV2 is m.

In this case, compared to the light-emitting substrate 100' shown in FIG. 1 where one second power supply voltage signal line LV2' is coupled to light-emitting components 20' in one light-emitting area S' and the number of the second power supply voltage signal lines LV2' is (n×m), the number of the second power supply voltage signal lines LV2 in the light-emitting substrate 100 in the embodiments of the present disclosure is reduced. For example, in a case where the second power supply voltage signal line LV2 extends in the row direction, the number of the second power supply voltage signal lines LV2 is n; and in a case where the second power supply voltage signal line LV2 extends in the column direction, the number of the second power supply voltage signal lines LV2 is m, which reduces the number of the signal lines of the light-emitting substrate 100. Since the number of the signal lines is reduced, the spacing between the signal lines is relatively increased. Therefore, the width of the signal line may be appropriately increased to reduce the impedance of the signal line and the voltage drop on the signal line, which improves the stability of the signal. Moreover, in the case where the flexible circuit board is used to bind the light-emitting substrate 100 to the external driving circuit, since the number of the wires is reduced, the number of the flexible circuit boards is also reduced accordingly, so that the production cost is reduced.

In some embodiments, the first power supply voltage signal line LV1 and the second power supply voltage signal line LV2 both extend in the column direction, or both extend in the row direction.

For example, the light-emitting substrate 100 includes light-emitting areas S arranged in n rows and m columns and first control circuits 30 arranged in n rows and m columns, and the first power supply voltage signal line LV1 and the second power supply voltage signal line LV2 extend in the row direction. In this case, a total number of the first power supply voltage signal line LV1 and the second power supply voltage signal line LV2 is (2×n). In the case where the light-emitting components 20 in a same column of light-emitting areas S are coupled to one second power supply voltage signal line LV2, the first power supply voltage signal line LV1 and the second power supply voltage signal line LV2 extend in the column direction, and in this case, a total number of the first power supply voltage signal lines LV1 and the second power supply voltage signal lines LV2 is (2×m).

Therefore, compared to the light-emitting substrate 100' where one second power supply voltage signal line LV2 and one first power supply voltage signal line LV1 are coupled to the light-emitting components 20 in one light-emitting area S and the total number of the first power supply voltage signal lines LV1 and the second power supply voltage signal lines LV2 is 2×(n×m), the number of the first power supply voltage signal lines LV1 and the number of the second power supply voltage signal lines LV2 in the light-emitting substrate 100 in the embodiments of the present disclosure are reduced. For example, in the case where the first power supply voltage signal line LV1 and the second power supply voltage signal line LV2 extend in the row direction, the total number of the first power supply voltage signal lines LV1 and the second power supply voltage signal lines LV2 is (2×n), and in a case where the first power supply voltage signal line LV1 and the second power supply voltage signal line LV2 extend in the column direction, the total number of the first power supply voltage signal lines LV1 and the second power supply voltage signal lines LV2 is (2×m), which reduces the number of the signal lines of the light-emitting substrate 100, and simplifies the wiring design of the light-emitting substrate 100. Since the number of the signal lines is reduced, the spacing between the signal lines is relatively increased. Therefore, the width of the signal line may be appropriately increased to reduce the impedance of the signal line and the voltage drop on the signal line, which improves the stability of the signal. Moreover, in a case where the flexible circuit board is used to bind the external driving circuit to the light-emitting substrate 100, since the number of the wires is reduced, the number of the flexible circuit boards is also reduced accordingly, so that the production cost is reduced.

In some embodiments, the second power supply voltage signal line LV2 and the first power supply voltage signal line LV1 are of a same material and are disposed on a same layer.

In terms of process, the second power supply voltage signal line LV2 and the first power supply voltage signal line LV1 may be formed simultaneously, thereby simplifying the production process.

Figure 11:
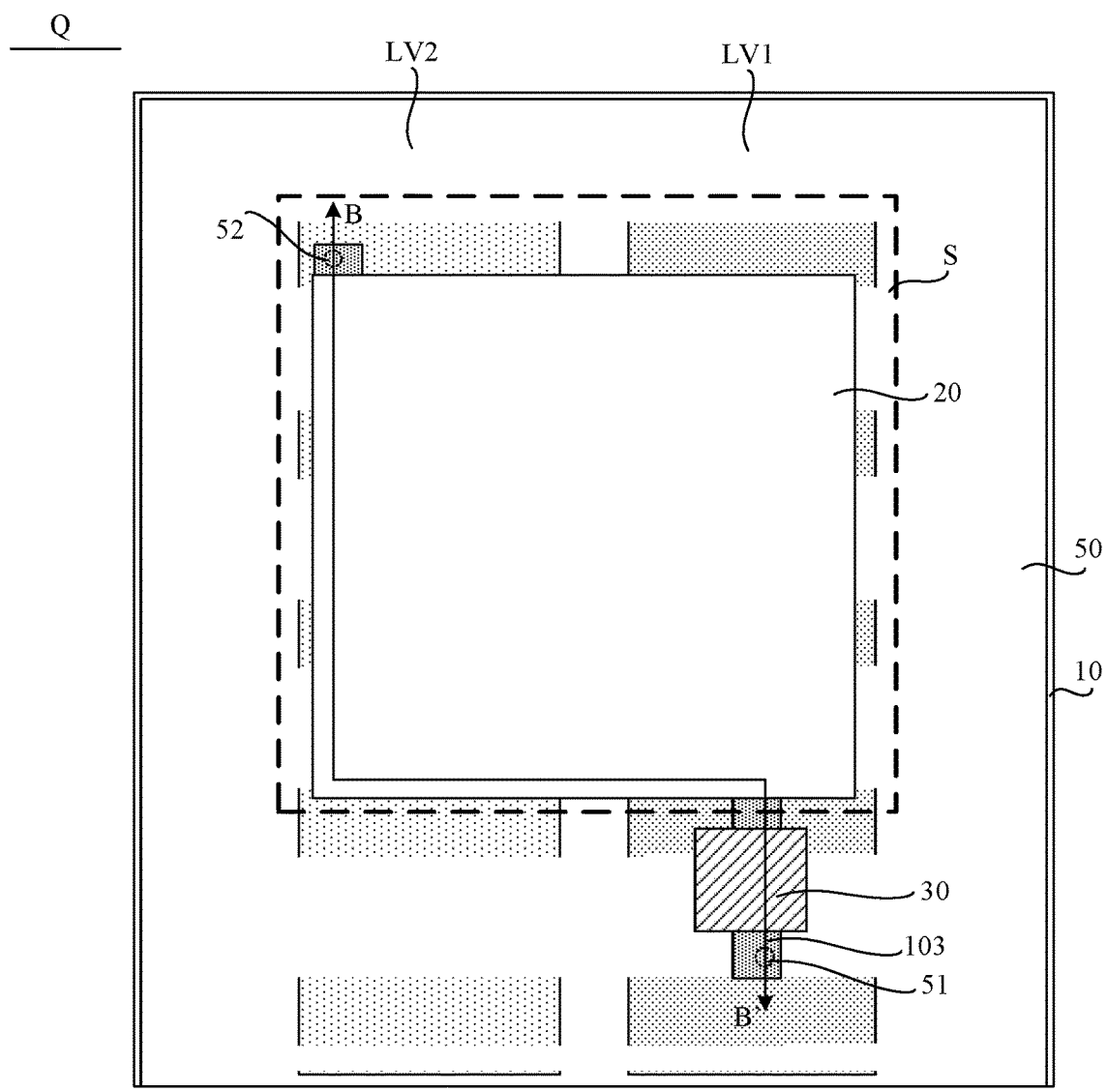
FIG. 11 is a diagram showing a structure of a Q region of the light-emitting substrate in FIG. 2.
Figure 12:
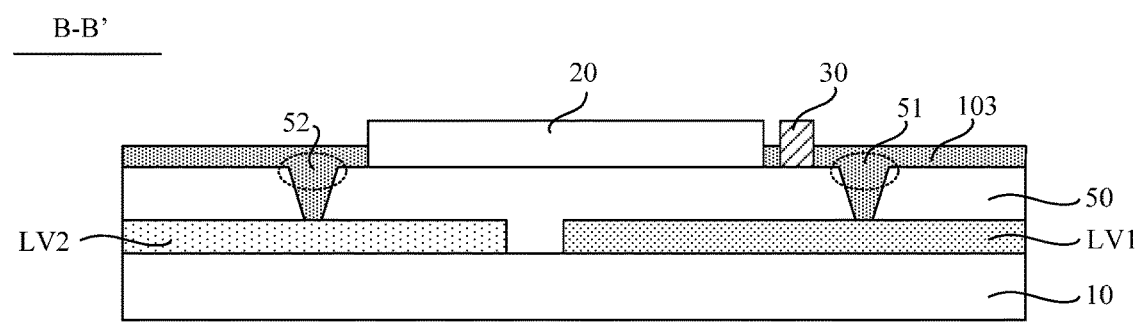
FIG. 12 is a sectional view of the light-emitting substrate in FIG. 11 along line B-B'.

In some embodiments, as shown in FIGS. 11 and 12, the light-emitting substrate 100 further includes an insulating layer 50.

In a direction perpendicular to the base 10, the first power supply voltage signal line LV1 and the second power supply voltage signal line LV2 are located on a side, proximate to the base 10, of the insulating layer 50, and the light-emitting component 20 and the first control circuit 30 are located on a side, away from the base 10, of the insulating layer 50.

The insulating layer 50 is provided with a first via 51 and a second via 52. The first control circuit 30 is coupled to the first power supply voltage signal line LV1 through the first via 51, and the second electrode of the light-emitting component 20 is coupled to the second power supply voltage signal line LV2 through the second via 52.

The light-emitting substrate 100 further includes a connection pattern 103 disposed on the side, away from the base 10, of the insulating layer 50, and the connection pattern 103 covers the first via 51 and the second via 52. The first control circuit 30 is coupled to the first power supply voltage signal line LV1 through the connection pattern 103 and the first via 51, and the first control circuit 30 is also coupled to the first electrode of the light-emitting component 20 through the connection pattern 103. The second electrode of the light-emitting component 20 is coupled to the second power supply voltage signal line LV2 through the connection pattern 103 and the second via 52.

For example, the insulating layer 50 may be of an inorganic material including silicon nitride ($Si_xN_y$) or silicon oxide ($SiO_x$).

In some embodiments, as shown in FIG. 7, in a case where the light-emitting substrate 100 further includes the second control circuit 40, the light-emitting substrate 100 further includes a plurality of connecting leads 60 disposed on the side, away from the base 10, of the insulating layer 50.

The plurality of connecting leads 60 are configured to couple respective first control circuits 30 with the second control circuit 40.

In some embodiments, in a case where the light-emitting substrate 100 includes the first control chip 101 and the second control chip 102, a part of the plurality of connecting leads 60 are used to couple the enable signal interfaces E in the second control chip 102 with the second interfaces P2 in each row of the first control chips 101, and another part of the plurality of connecting leads 60 are used to couple the light-emission signal interfaces L in the second control chip 102 with the first interfaces P1 in respective first control chips 101. For example, in a case where the light-emitting substrate 100 includes the first control chips 101 arranged in n rows and m columns, the second interfaces P2 in the first control chips 101 in the first row are coupled to the enable signal interfaces E(1) in the second control chip 102 through the connecting lead 60, and the second interfaces P2 in the first control chips 101 in the n-th row are coupled to the enable signal interfaces E(n) in the second control chip 102 through the connecting lead 60; and the first interface P1 in the first control chip 101 in the first row and the first column is coupled to the light-emission signal interface L(1_1) in the second control chip 102 through the connecting lead 60, and the first interface P1 in the first control chip 101 in the n-th row and m-th column is coupled to the light-emission signal interface L(m_n) in the second control chip 102 through the connecting lead 60.

For example, the connection lead 60 may be of a metal material including copper (Cu) or aluminum (Al).

Figure 13:
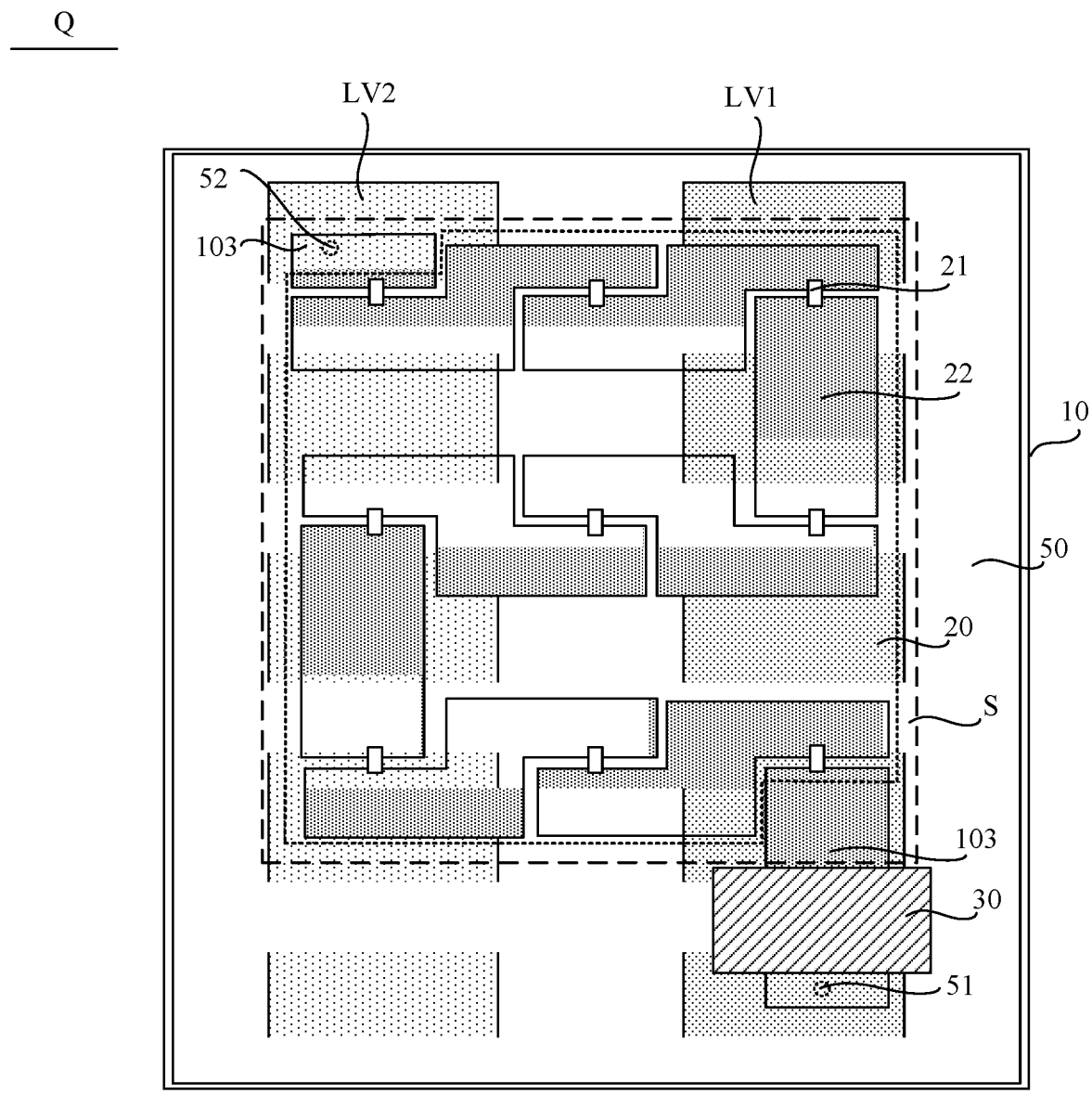
FIG. 13 is a diagram showing another structure of the Q region of the light-emitting substrate in FIG. 2.

In some embodiments, as shown in FIG. 13, the light-emitting component 20 includes: a plurality of light-emitting devices 21 and a plurality of conductive patterns 22. The plurality of light-emitting devices 21 are arranged in an array. The plurality of conductive patterns 22 sequentially connect the plurality of light-emitting devices 21 in series.

In a line formed by connecting the plurality of light-emitting devices 31 in series, a cathode of one of two light-emitting devices 31 located at both ends of the line is the first electrode of the light-emitting component 20, and an anode of another light-emitting device 31 of the two light-emitting devices is the second electrode of the light-emitting component 20.

For example, the light-emitting device 31 may be an inorganic light-emitting device including a micro LED or a mini LED.

It will be noted that, the plurality of light-emitting devices 21 are sequentially connected. That is, the plurality of light-emitting devices 21 are connected in series. In addition, the plurality of light-emitting devices 21 may also be connected in parallel, or, a part of the plurality of light-emitting devices 21 are connected in series and then connected in parallel with another part of the light-emitting devices 21. Those skilled in the art can select a connection manner of the light-emitting devices 21 in the light-emitting areas S according to actual conditions, which is not limited in the present disclosure.

For example, in a case where the plurality of light-emitting devices 21 are connected in series with each other, in a light-emitting area S, a shape of a conductive patterns 22 for the light-emitting devices 21 connected in series in a same row is in a fold line shape, and a shape of a conductive pattern 22 for the light-emitting devices 21 connected in series in a same column is in a stripe shape; or, the shape of the conductive pattern 22 for the light-emitting devices 21 connected in series in a same column is in a fold line shape, and the shape of the conductive pattern 22 of the light-emitting devices 21 connected in series in a same row is in a stripe shape.

Since in a direction perpendicular to the base 10, the plurality of conductive patterns 22 are located on a side, away from the base 10, of the first power supply voltage signal line LV1 and the second power supply voltage signal line LV2, and the plurality of conductive patterns 22 are located in a different layer from that of the first power supply voltage signal line LV1 and the second power supply voltage signal line LV2, the conductive pattern 22 has little effect on a wiring space of the first power supply voltage signal line LV1 and the second power supply voltage signal line LV2. In this way, it is avoided that widths of the first power supply voltage signal line LV1 and the second power supply voltage signal line LV2 are reduced due to a reduction of a wiring gap between the first power supply voltage signal line LV1 and the second power supply voltage signal line LV2, which causes impedances of the first power supply voltage signal line LV1 and the second power supply voltage signal line LV2 to increase, and affects the signal transmission.

In a case where the light-emitting substrate 100 includes the connection pattern 103, the conductive pattern 22 and the connection pattern 103 are made of a same material and disposed on a same layer. In terms of process, the conductive pattern 22 and the connection pattern 103 are formed through a same one film forming process. It will be noted that, in some embodiments of the present disclosure, the first control circuit 30 may be disposed outside the light-emitting area S and adjacent to the light-emitting component 20. As shown in FIG. 13, in other embodiments of the present disclosure, the first control circuit 30 may be directly disposed within the light-emitting area S. For example, an orthographic projection of the first control circuit 30 on the base and an orthographic projection of any one of the conductive pattern 22, the connection pattern 103, the light-emitting device 31, the first power supply voltage signal line LV1 and the second power supply voltage signal line LV2 on the base may not overlap. Of course, the orthographic projection of the first control circuit 30 on the base may also partially overlap the orthographic projection of any one of the conductive pattern 22, the connection pattern 103, the light-emitting device 31, the first power supply voltage signal line LV1 and the second power supply voltage signal line LV2 on the base.

Figure 14:
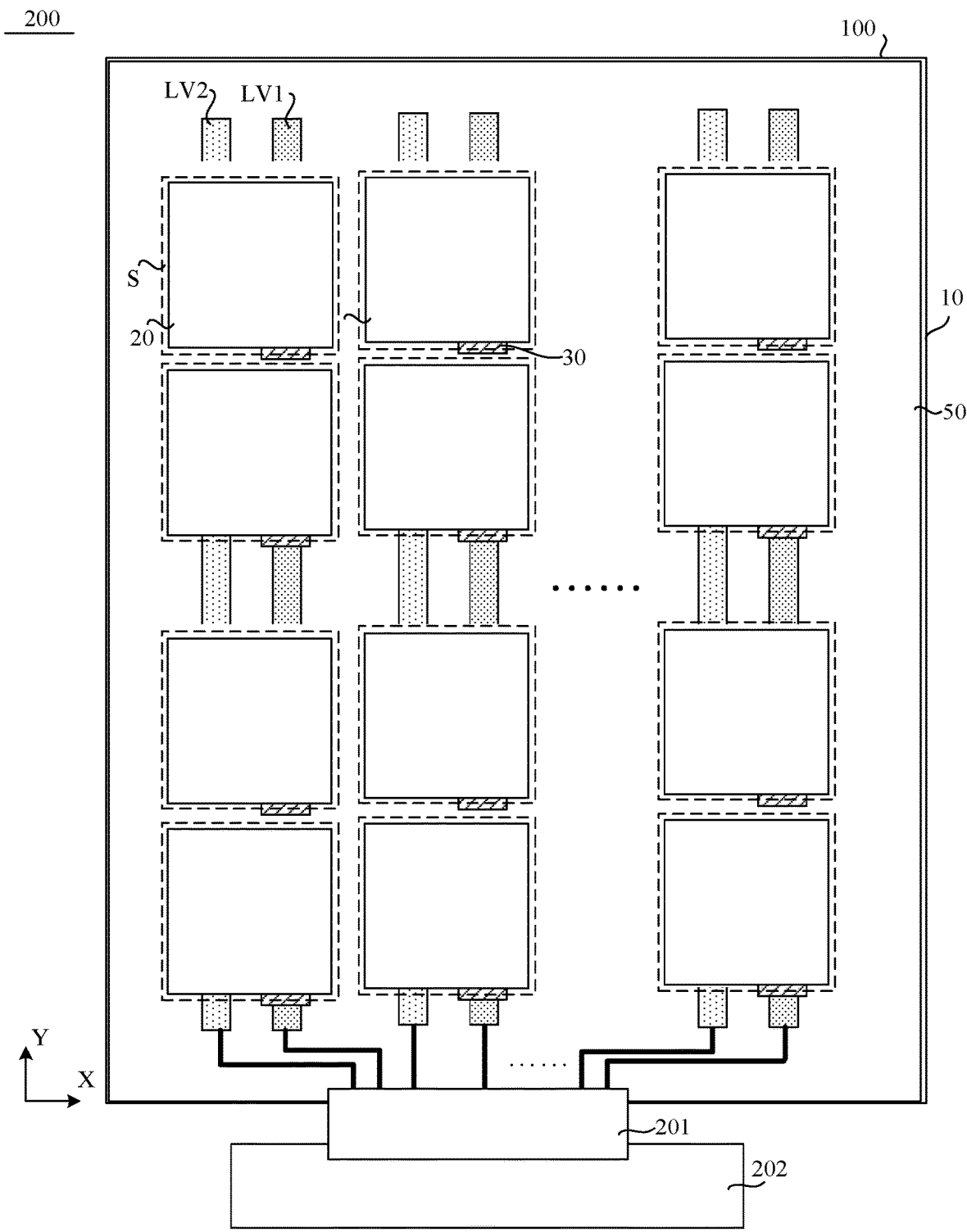
FIG. 14 is a diagram showing a structure of a light-emitting module, according to some embodiments of the disclosure.

Some embodiments of the present disclosure provide a light-emitting module 200, as shown in FIG. 14, which includes: the light-emitting substrate 100 as described in any of the above embodiments, a flexible circuit board 201 and a power supply chip 202.

The light-emitting substrate 100 includes the first power supply voltage signal line LV1 and the second power supply voltage signal line LV2.

The power supply chip 202 is bound to the light-emitting substrate 100 through the flexible circuit board 201. The power supply chip 202 is configured to transmit the first power supply voltage signal to the first power supply voltage signal line LV1 and transmit the second power supply voltage signal to the second power supply voltage signal line LV2.

In some embodiments, referring to FIG. 7, in a case where the light-emitting substrate 100 includes the second control circuit 40, the power supply chip 202 is configured to transmit a third power supply voltage signal and a fourth supply power voltage signal to the second control circuit 40.

For example, in a case where the light-emitting substrate 100 includes the second control chip 102, as shown in FIG. 10, the second control chip 102 further includes a third power supply voltage signal interface VDD and a fourth power supply voltage signal interface GND. The third power supply voltage signal interface VDD is configured to receive the third power supply voltage signal from the power supply chip 202, and the fourth power supply voltage signal interface GND is configured to receive the fourth power supply voltage signal from the power supply chip 202.

The third power supply voltage signal is a direct current high voltage signal, such as a signal from a positive pole of a power source, and the fourth power supply voltage signal is a direct current low voltage signal, such as a signal from the negative electrode of the power supply. A potential of the third power supply voltage signal is higher than a potential of the second power supply voltage signal. A potential of the fourth power supply voltage signal is equal to a potential of the first power supply voltage signal.

Figure 15:
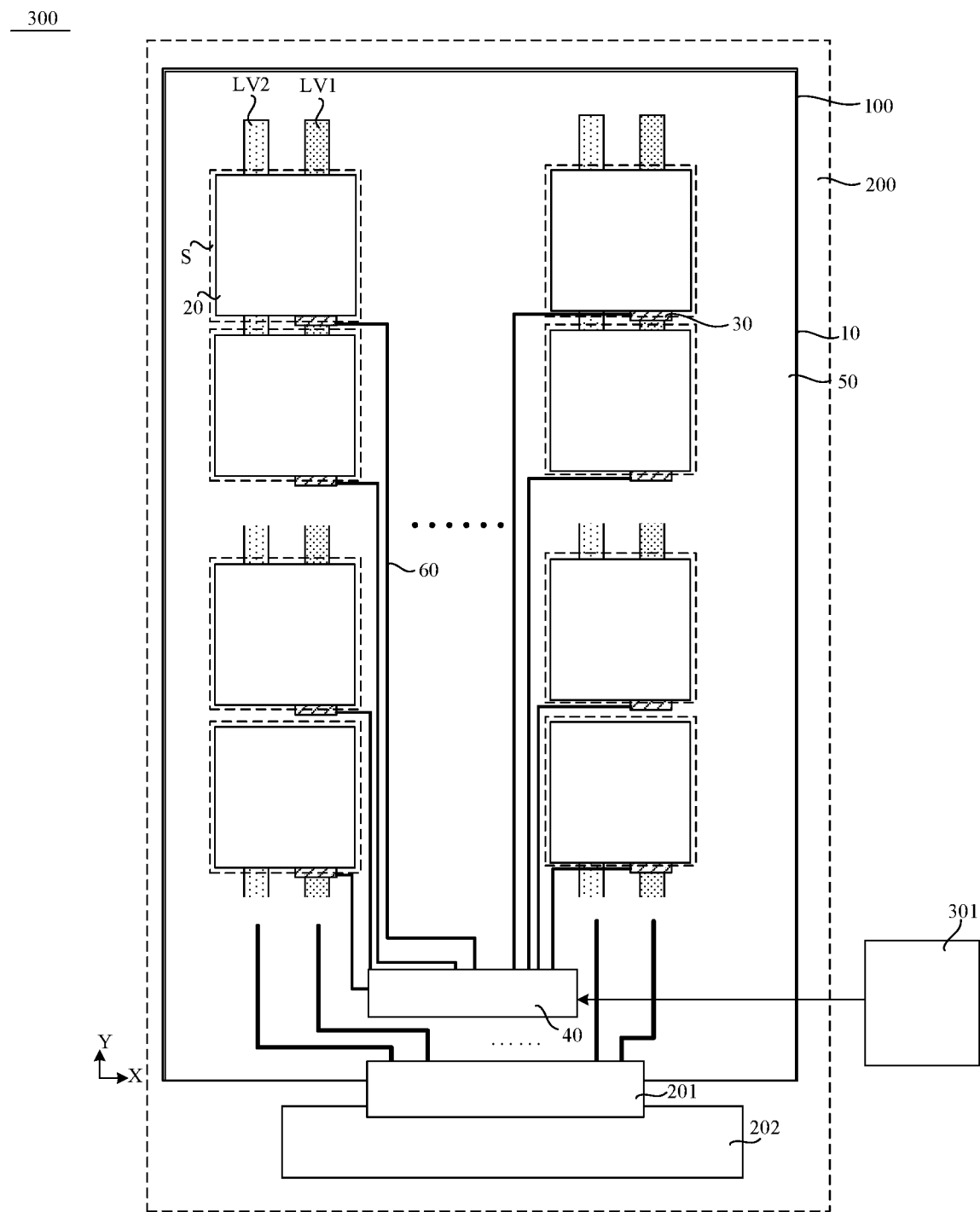
FIG. 15 is a diagram showing a structure of a display apparatus, according to some embodiments of the disclosure.

The embodiments of the present disclosure further provide a display apparatus 300, as shown in FIG. 15, which includes: the light-emitting module 200 as described in any of the above embodiments and a driving chip 301.

The light-emitting substrate 100 in the light-emitting module 200 includes a plurality of first control circuits 30 and a second control circuit 40. The driving chip 301 is coupled to the second control circuit 40. The driving chip 301 is configured to transmit a driving signal to the second control circuit 40.

For example, the driving chip 301 may be a SOC or a T-con.

In this case, the driving chip 301 transmits the driving signal to the second control circuit 40. The second control circuit 40 receives the driving signal, and transmits the first light-emission signal and the first enable signal to each first control circuit 30 according to the driving signal. The first control circuit 30 receives the first light-emission signal and the first enable signal, and transmits the first power supply voltage signal to the first electrode of the light-emitting component 20 coupled to the first control circuit 30 according to the first light-emission signal and the first enable signal to control the amplitude of the current flowing through the light-emitting component 20 and thus to control the light-emitting brightness of the light-emitting component 20.

Figure 16:
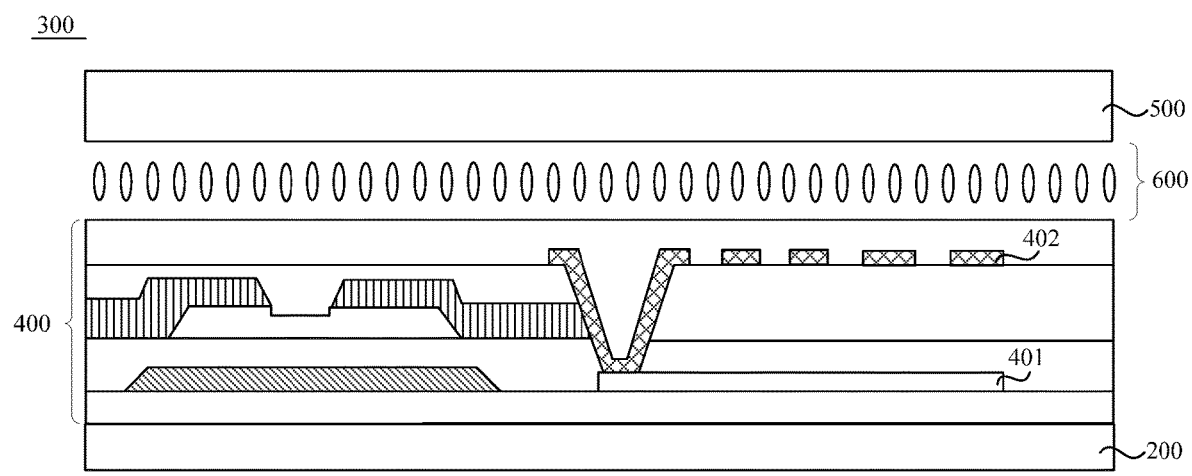
FIG. 16 is a diagram showing another structure of a display apparatus, according to some embodiments of the disclosure.

In some embodiments, in a case where the display apparatus 300 is a liquid crystal display apparatus, the light-emitting module 200 is a backlight module. As shown in FIG. 16, the display apparatus 300 further includes an array substrate 400, a counter substrate 500 and a liquid crystal layer 600. The counter substrate 500 is disposed opposite to the array substrate 400, and the light-emitting module 200 is disposed on a side, away from the counter substrate 500, of the array substrate 400. The liquid crystal layer 600 is located between the counter substrate 500 and the array substrate 400.

For example, in a display process of the display apparatus 300, liquid crystal molecules in the liquid crystal layer 600 are deflected under an action of an electric field formed between a pixel electrode 401 and a common electrode 402 in the array substrate 400, and light emitted by the light-emitting module 200 passes through the liquid crystal layer 600 and exits from a side, away from the light-emitting module 200, of the counter substrate 500.

The display apparatus 300 can be any apparatus that displays an image, moving (for example a video) or still (for example a static image), literal or graphical. More specifically, it is contemplated that the described embodiments may be implemented in or associated with a variety of electronic apparatus. The variety of electronic apparatus may include (but not limit to), for example, mobile telephones, wireless apparatus, personal data assistant (PAD), hand-held or portable computers, global positioning system (GPS) receivers/navigators, cameras, MPEG-4 Part 14 (MP4) video players, a vidicon, game consoles, watches, clocks, calculators, TV monitors, flat panel displays, computer monitors, car displays (such as odometer display etc.), navigators, cockpit controllers and/or displays, camera view displays (such as rear view camera display in a vehicle), electronic photos, electronic billboards or signages, projectors, building structures, packaging and aesthetic structures (such as a display for an image of a piece of jewelry) etc.

The embodiments of the present disclosure further provide a method for driving a light-emitting substrate. The light-emitting substrate is the light-emitting substrate 100 as described in any of the above embodiments. Referring to FIG. 8, the light-emitting substrate 100 includes the first control circuit 30 and the second control circuit 40.

The method for driving the light-emitting substrate 100 includes the following steps.

The second control circuit 40 receives the driving signal DRV, and transmits the first light-emission signal EM1 and the first enable signal PW1 to each first control circuit 30 according to the driving signal DRV.

The first control circuit 30 transmits the first power supply voltage signal V1 from the first power supply voltage signal line LV1 to the first electrode of the light-emitting component 20 coupled to the first control circuit 30 according to the first light-emission signal EM1 and the first enable signal PW1, so as to control the amplitude of current flowing through the light-emitting component 20.

In this case, the second control circuit 40 transmits the first light-emission signal EM1 and the first enable signal PW1 to the first control circuit 30 coupled to the light-emitting component 20 in the light-emitting area S according to the driving signal DRV. Potentials of the first light-emission signals EM1 and the first enable signals PW1 received by the first control circuits 30 coupled to different light-emitting components 20 are not completely the same. The first control circuit 30 transmits the first power supply voltage signal V1 to the first electrode of the light-emitting component 20 coupled to the first control circuit 30 according to the first enable signal PW1 and the first light-emission signal EM1. By adjusting the potential of the first light-emission signal EM1 and controlling the operating duration of the light-emitting component 20, and by adjusting the potential of the first enable signal PW1 and controlling the amplitude of the current flowing through the light-emitting component 20, the light-emitting brightness of the light-emitting components 20 in respective light-emitting area S is controlled.

In some embodiments, in a case where the plurality of first control circuits 30 in the light-emitting substrate 100 are arranged in the array, the transmitting, by the second control circuit 40, the first enable signal PW1 to each first control circuit 30 includes:

Transmitting, by the second control circuit 40, the first enable signal PW1 to each row of the first control circuit row by row in a driving period, so as to control each row of the first control circuits 30 to be turned on sequentially, and a previous row of the first control circuits to be turned off before a next row of the first control circuits are turned on.

Figure 17:
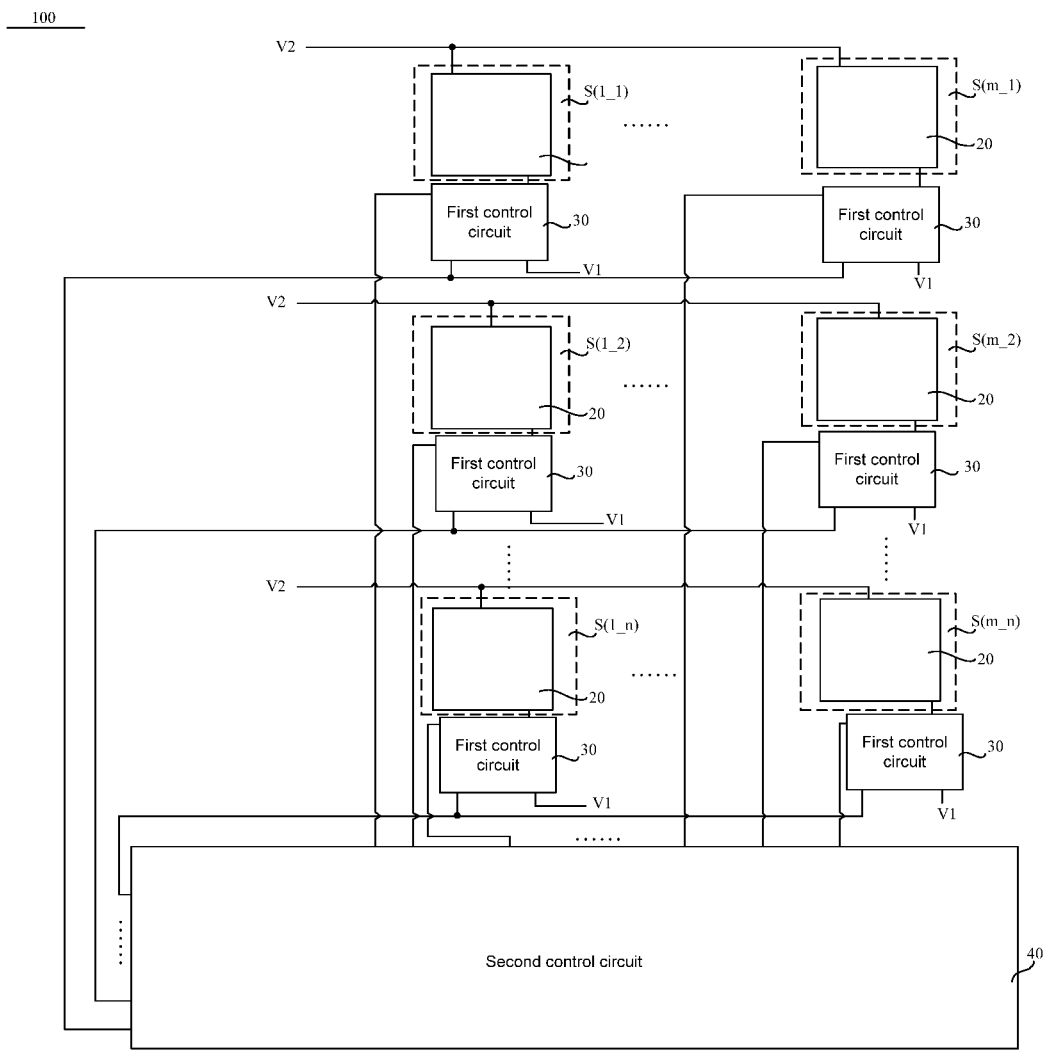
FIG. 17 is a diagram showing yet another structure of a light-emitting substrate, according to some embodiments of the disclosure.
Figure 19:
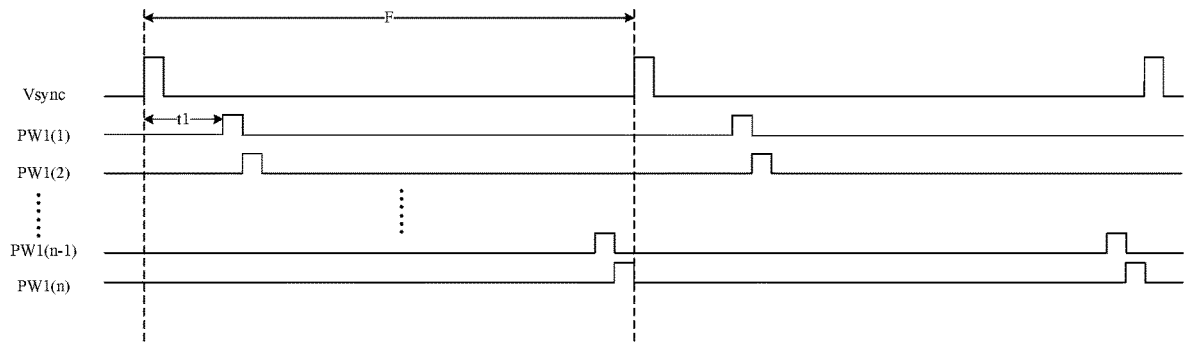
FIG. 19 is a driving timing diagram of a light-emitting substrate, according to some embodiments of the disclosure.

For example, referring to FIG. 17, the plurality of light-emitting areas (S(1_1) . . . S(m_n)) are arranged in n rows and m columns. For example, a light-emitting area S(1_1) is a light-emitting area in the first row and the 1st column, the light-emitting area S(m_n) is a light-emitting area in the n-th row and the m-th column, and the plurality of first control circuits 30 are arranged in n rows and m columns. In a driving period F (as shown in FIG. 19), the second control circuit 40 transmits the first enable signals (PW1(1) . . . PW1(n)) row by row to the first control circuits 30 from the first row to the n-th row, and controls each row of the first control circuits 30 to be turned on sequentially. Moreover, the second control circuit 40 transmits the first light-emission signal EM1 to each first control circuit 30. For example, when the first row of the first control circuits 30 receive the first enable signal PW1(1), the second control circuit 40 transmits the first light-emission signal EM1 to the first control circuits 30 in the first row and the first column through the first row and the m-th column.

In this case, the first control circuit 30 is turned on under the control of the first enable signal PW1 and the first light-emission signal EM1, and transmits the first power supply voltage signal V1 from the first power supply voltage signal line LV1 to the first electrode of the light-emitting component 20 in the light-emitting area S coupled to the first control circuit 30, so as to cause the light-emitting component 20 to operate.

Figure 18:
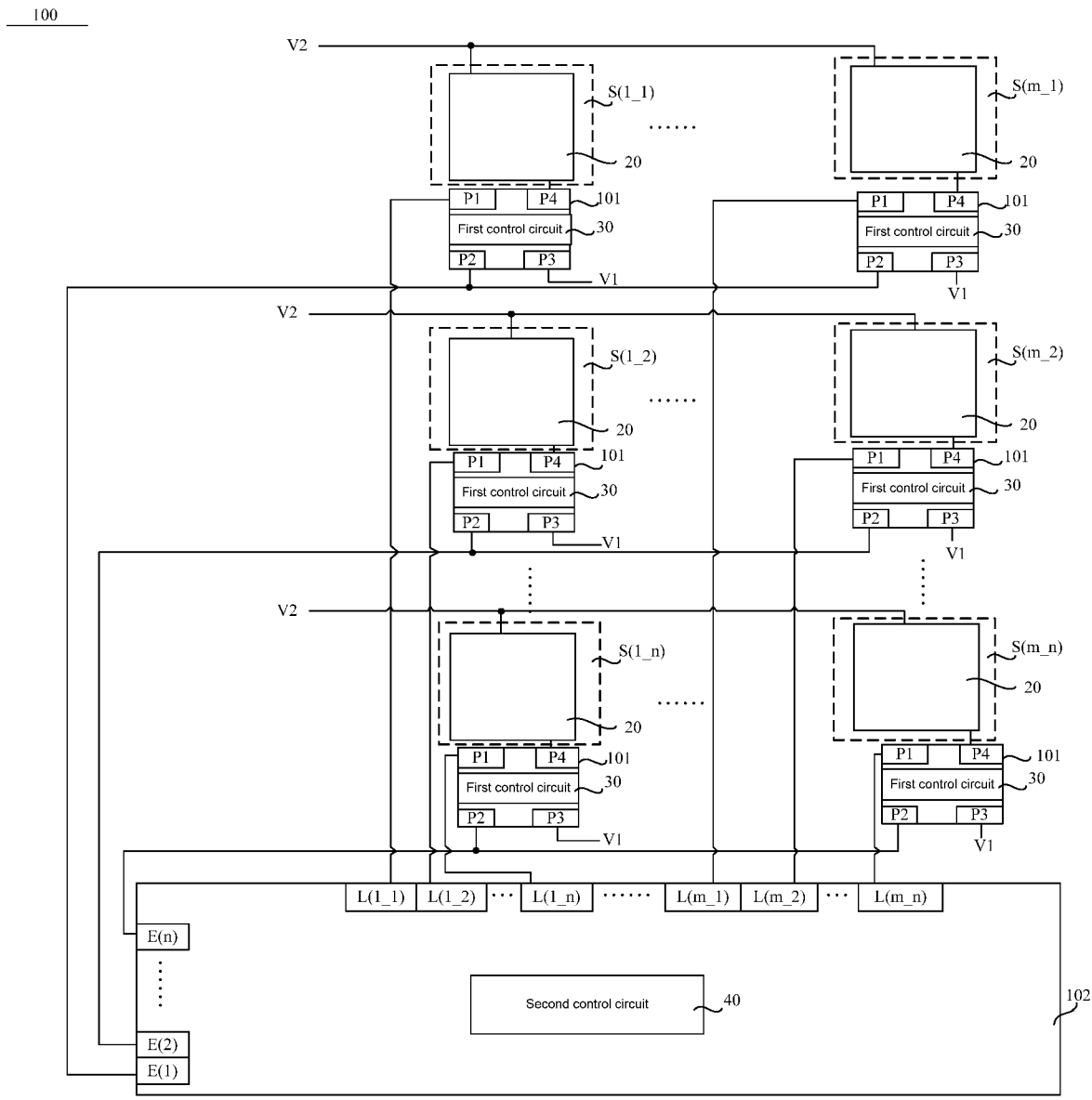
FIG. 18 is a diagram showing yet another structure of a light-emitting substrate, according to some embodiments of the disclosure.

For example, referring to FIG. 18, in a case where the light-emitting substrate 100 includes the first control chip 101 and the second control chip 102, the enable signal interface E in the second control chip 102 is coupled to the second interface P2 in the first control chip 101, and each enable signal interface E is coupled to one row of first control circuits 30. For example, the enable signal interface E(1) is coupled to the first row of the first control circuits 30, the enable signal interface E(2) is coupled to the second row of the first control circuits 30, and the enable signal interface E(n) is coupled to the n-th row of the first control circuits 30. In this case, the plurality of enable signal interfaces (E(1), E(2) . . . E(n−1), E(n)) of the second control chip 102 sequentially transmit the first enable signals (PW1(1) . . . PW1($n$)) to the first control circuits 30 in the first row to the n-th row to sequentially control the first control circuits 30 in the first row to the n-th row to be turned on. The light-emission signal interface L in the second control chip 102 is coupled to the first interface P1 in the first control chip 101, each light-emission signal interface L is coupled to one first control circuit 30, and transmits the first light-emission signal EM1 to the first control circuit 30 coupled thereto. For example, the light-emission signal interface L(m_n) is coupled to the first control circuit 30 in the n-th row and the m-th column, and the light-emission signal interface L(m_n) transmits the first light-emission signal corresponding to the light-emitting area S(m_n) in the n-th row and the m-th column to the first control circuit 30 in the n-th row and the m-th column.

In this basis, the first control circuit 30 is turned on under the control of the first light-emission signal EM1 and the first enable signal PW1, and transmits the first power supply voltage signal V1 to the first electrode of the light-emitting component 20 coupled thereto to cause the light-emitting component 20 to operate.

Moreover, the previous row of the first control circuits are turned off before the next row of the first control circuit is turned on. For example, after the first row of the first control circuits 30 are turned off, the second row of the first control circuits 30 are turned on; after the second row of the first control circuits 30 are turned off, the third row of the first control circuits 30 are turned on; and so on until the (n−1)th row of the first control circuit 30 are turned off, and the n-th row of the first control circuit 30 is turned on. In this case, light-emitting components 20 in the first row to the n-th row in the light-emitting substrate 100 operate row by row, which shortens the operating duration of each row of the light-emitting components 20, and reduces a power consumption of the light-emitting substrate 100.

In some embodiments, in a case where the plurality of first control circuits 30 in the light-emitting substrate 100 are arranged in the array, the transmitting, by the second control circuit 40, the first enable signal PW1 to each first control circuit 30 includes:

In a driving period, the second control circuit 40 simultaneously transmits the first enable signal PW1 to each row of the first control circuits to control respective rows of the first control circuits to be turned on simultaneously, and each row of the first control circuits are turned off in the current driving period before each row of the first control circuits are turned on in the next driving period.

Figure 20:
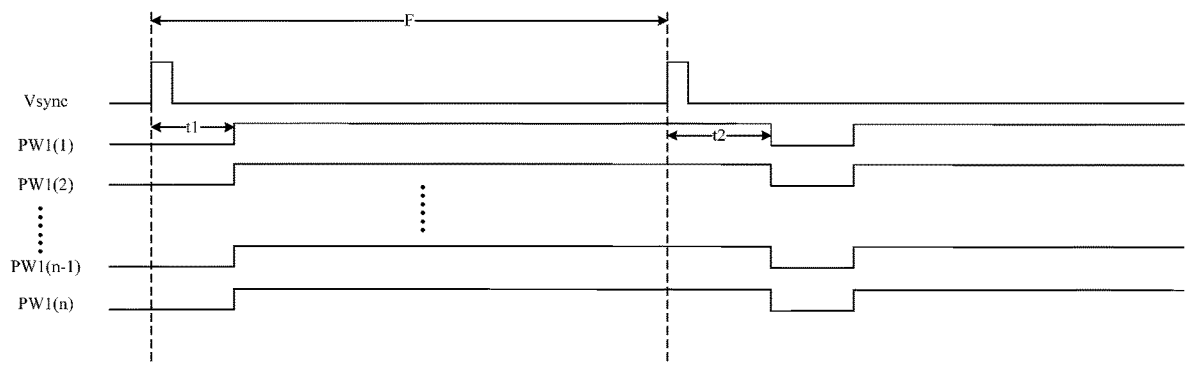
FIG. 20 is another driving timing diagram of a light-emitting substrate, according to some embodiments of the disclosure.

For example, referring to FIG. 17, the plurality of first control circuits 30 are arranged in n rows and m columns. In a driving period F (as shown in FIG. 20), the second control circuit 40 simultaneously transmits the first enable signal PW1 to the first control circuits 30 from the first row to the n-th row, and controls each row of the first control circuits 30 to be turned on at the same time. Moreover, the second control circuit 40 transmits the first light-emission signal EM1 to each first control circuit 30. In this case, the first control circuit 30 is turned on under the control of the first enable signal PW1 and the first light-emission signal EM1, and transmits the first power supply voltage signal V1 from the first power supply voltage signal line LV1 to the first electrode of the light-emitting component 20 in the light-emitting area S coupled to the first control circuit 30 so as to cause the light-emitting component 20 to operate.

For example, referring to FIG. 18, in a case where the light-emitting substrate 100 includes the first control chip 101 and the second control chip 102, each enable signal interface E is coupled to a row of first control circuits 30, a plurality of enable signal interfaces (E(1), E(2) . . . E(n−1), E(n)) of the second control chip 102 simultaneously transmit the first enable signals (PW1(1) . . . PW1($n$)) to the first control circuits 30 in the first row to the n-th row to control the first control circuits 30 in the first row to the n-th row to be turned on at the same time. Each light-emission signal interface L in the second control chip 102 is coupled to one first control circuit 30, and transmit the first light-emission signal EM1 to the first control circuit 30 coupled thereto. The first control circuit 30 is turned on under the control of the first light-emission signal EM1 and the first enable signal PW1, and transmits the first power supply voltage signal V1 to the first electrode of the light-emitting component 20 coupled thereto to cause the light-emitting component 20 to operate.

In some embodiments, in a case where the plurality of first control circuits 30 in the light-emitting substrate 100 are arranged in the array, the transmitting, by the second control circuit 40, the first enable signal PW1 to each first control circuit 30 includes:

In a driving period, the second control circuit 40 sequentially transmits the first enable signal PW1 to each row of the first control circuits to control respective rows of the first control circuits to be turned on sequentially, and each row of the first control circuits are turned off in the current driving period before each row of the first control circuits are turned on in the next driving period.

Figure 21:
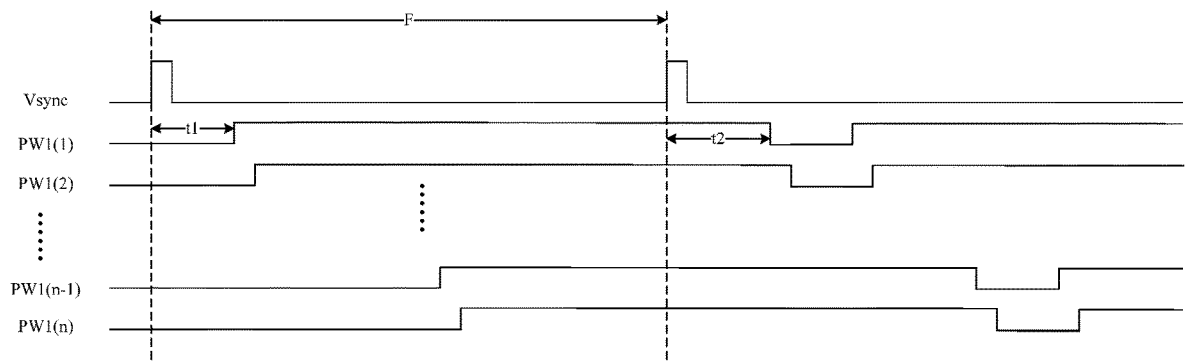
FIG. 21 is yet another driving timing diagram of a light-emitting substrate, according to some embodiments.

For example, referring to FIG. 17, the plurality of first control circuits 30 are arranged in n rows and m columns. In a driving period F (as shown in FIG. 21), the second control circuit 40 transmits the first enable signals (PW1(1) . . . PW1($n$)) row by row to the first control circuits 30 from the first row to the n-th row, and controls each row of the first control circuits 30 to be turned on sequentially. Moreover, the second control circuit 40 transmits the first light-emission signal EM1 to each first control circuit 30, the first control circuit 30 is turned on under the control of the first enable signal PW1 and the first light-emission signal EM1, and transmits the first power supply voltage signal V1 from the first power supply voltage signal line LV1 to the first electrode of the light-emitting component 20 in the light-emitting area S coupled to the first control circuit 30 to cause the light-emitting component 20 to operate.

For example, referring to FIG. 18, in a case where the light-emitting substrate 100 includes the second control chip 102, each enable signal interface E is coupled to a row of first control circuits 30, a plurality of enable signal interfaces (E(1), E(2) . . . E(n−1), E(n)) of the second control chip 102 sequentially transmit the first enable signals (PW1(1) . . . PW1($n$)) to the first control circuits 30 in the first row to the n-th row to control the first control circuits 30 in the first row to the n-th row to be turned on sequentially. Each light-emission signal interface L in the second control chip 102 is coupled to a first control circuit 30, and transmit the first light-emission signal EM1 to the first control circuit 30 coupled thereto. The first control circuit 30 is turned on under the control of the first light-emission signal EM1 and the first enable signal PW1, and transmits the first power supply voltage signal V1 to the first electrode of the light-emitting component 20 coupled thereto to cause the light-emitting component 20 to operate.

In addition, each row of the first control circuits are turned off in the current driving period before the each row of the first control circuits are turned on in the next driving period. The first control circuits 30 in the first row to the n-th row are turned on sequentially, and the operating durations of the first control circuits 30 in the first row to the n-th row are the same.

In this basis, in a case where the light-emitting substrate 100 is applied to a liquid crystal display apparatus, in view of a certain time is required for a response of the liquid crystal molecules, each row of the first control circuits 30 is delayed to be turned on at the beginning of a driving period. For example, as shown in FIGS. 19, 20, and 21, when the vertical frame synchronization signal Vsync in a driving period is active, the enable signal interface E(1) transmits the first enable signal to the first row of the first control circuits 30 coupled thereto, so that there is a first delay time t1 for turning on the first row of the first control circuits 30. Similarly, after the end of the driving period and at the beginning of a next driving period, there is a certain delay for turning off each row of the first control circuits 30. For example, as shown in FIGS. 20 and 21, when the vertical frame synchronization signal Vsync in the next driving period is active, the enable signal interface E(1) transmits the first enable signal to the first row of the first control circuits 30 coupled thereto, so that there is a second delay time t2 for turning off the first row of the first control circuit 30.

In this case, a state of the liquid crystal molecule may be adjusted in the first delay time t1 and the second delay time t2, so that the liquid crystal molecule is in a stable state when the light-emitting component 20 operates, which avoids a smearing problem on a displayed image due to unstable liquid crystal molecules when the light-emitting component 20 operates, and improves a display performance. In addition, a light-emitting duration of the light-emitting component 20 may be guaranteed, and loss of electro optic conversion efficiency may be reduced.

It will be noted that, as shown in FIGS. 19, 20 and 21, the first enable signal transmitted by the enable signal interface E(1) to the first row of the first control circuits 30 coupled thereto is represented by PW1(1), the first enable signal transmitted by the enable signal interface E(2) to the second row of the first control circuit 30s coupled thereto is represented by PW1(2), and the first enable signal transmitted by the enable signal interface E(n) to the n-th row of the first control circuit 30 coupled thereto is represented by PW1(n). In addition, for convenience of description, the vertical frame synchronization signal received by the vertical frame synchronization signal interface Vsync is represented by Vsync, but the same reference number does not mean that the two are the same component.

In some embodiments, referring to FIG. 4, the first control circuit 30 includes the processor 31, the analog-to-digital converter ADC and the first output sub-circuit 32. In this case, the first control circuit 30 transmitting the first power supply voltage signal V1 from the first power supply voltage signal line LV1 to the first electrode of the light-emitting component 20 coupled to the first control circuit 30 according to the first light-emission signal EM1 and the first enable signal PW1 includes the following steps.

The processor 31 receives the first light-emission signal EM1 and converts the format of the first light-emission signal EM1 and generates the second light-emission signal EM2;

The analog-to-digital converter ADC receives the first enable signal PW1 and generates the reference signal REF; and The first output sub-circuit 32 transmits the first power supply voltage signal V1 from the first power supply voltage signal line LV1 to the first electrode of the light-emitting component 20 according to the second light-emission signal EM2 and the reference signal REF.

In this case, the first output sub-circuit 32 is turned on under the control of the second light-emission signal EM2 and the reference signal REF, and transmits the first power supply voltage signal V1 to the first electrode of the light-emitting component 20. Since the potentials of the second light-emission signals EM2 generated by respective first control circuits 30 is not completely the same as the potentials of the reference signal REF generated, the operating time of the light-emitting component 20 may be controlled by adjusting the potential of the second light-emission signal EM2 and controlling the duration for which the first power supply voltage signal V1 is transmitted to the first electrode of the light-emitting component 20 by the first control circuit 30, and the amplitude of the current flowing through the light-emitting component 20 is controlled by adjusting the potential of the reference signal REF.

In some embodiments, referring to FIG. 8, the second control circuit 40 includes the timing control sub-circuit 41, the data processing sub-circuit 42, the memory 43 and the amplifier sub-circuit 44. In this case, the second control circuit 40 receiving the driving signal DRV, and transmitting the first light-emission signal EM1 and the first enable signal PW1 to each first control circuit 30 according to the driving signal DRV, includes the following steps:

The timing control sub-circuit 41 generates a clock signal;

The data processing sub-circuit 42 receives the driving signal DRV, outputs the second enable signal PW2 according to the driving signal DRV and the clock signal from the timing control sub-circuit 41, and transmits the first light-emission signal EM1 to the plurality of first control circuits 30.

The memory 43 stores the timing data and the light-emission current data for the preset light-emission mode.

The amplifier sub-circuit 44 amplifies the power of the second enable signal PW2 from the data processing sub-circuit 42 according to the timing data and the light-emission current data for the preset light-emission mode from the memory 43, generates the first enable signal PW1, and transmits the first enable signal PW1 to the plurality of first control circuits 30.

In this case, when the second control circuit 40 starts to operate, the timing control sub-circuit 41 generates the clock signal, and the data processing sub-circuit 42 transmits the first light-emission signal EM1 to the plurality of first control circuits 30 according to the clock signal and the received driving signal DRV, and transmits the second enable signal PW2 to the amplifier sub-circuit 44. The amplifier sub-circuit 44 amplifies the power of the second enable signal PW2 according to the timing data and the light-emission current data for the preset lighting mode stored in the memory 43, generates the first enable signal PW1, transmits the first enable signal PW1 to the plurality of first control circuits 30, and controls the magnitude of the current of the first control circuit 30 to drive the plurality of first control circuits 30 to operate, so as to realize a control of a operation state of the light-emitting component 20 coupled to the first control circuit 30.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A light-emitting substrate having a plurality of light-emitting areas, the light-emitting substrate comprising:
    a base;
    a plurality of light-emitting components disposed on the base, wherein one light-emitting component is located within one light-emitting area;
    a plurality of first power supply voltage signal lines disposed on the base and arranged at intervals; and
    a plurality of first control circuits disposed on the base, wherein each of the first control circuits is coupled to a first electrode of one light-emitting component, and each of first power supply voltage signal lines is coupled to at least two first control circuits; and the first control circuit is configured to transmit a first power supply voltage signal from the first power supply voltage signal line to the first electrode of the light-emitting component coupled to the first control circuit, so as to control an amplitude of a current flowing through the light-emitting component, wherein
    the first control circuit is specifically configured to receive a first light-emission signal and a first enable signal, and transmit the first power supply voltage signal to the first electrode of the light-emitting component coupled to the first control circuit according to the first light-emission signal and the first enable signal, so as to control the amplitude of the current flowing through the light-emitting component; and
    the first control circuit includes:
    a processor configured to receive the first light-emission signal, convert a format of the first light-emission signal, and generate a second light-emission signal;
    an analog-to-digital converter configured to receive the first enable signal and generate a reference signal; and
    a first output sub-circuit coupled to the processor, the analog-to-digital converter, the first power supply voltage signal line, and the first electrode of the light-emitting component, and configured to transmit the first power supply voltage signal from the first power supply voltage signal line to the first electrode of the light-emitting component according to the second light-emission signal from the processor and the reference signal from the analog-to-digital converter.

2. The light-emitting substrate according to claim 1, wherein the plurality of light-emitting areas are arranged in an array, and the plurality of first control circuits are arranged in an array; and
    the light-emitting components in a same row of light-emitting areas are coupled to one first power supply voltage signal line through a row of first control circuits, or, the light-emitting components in a same column of light-emitting areas are coupled to one first power supply voltage signal line through a column of first control circuits.

3. The light-emitting substrate according to claim 1, wherein the first output sub-circuit includes:
    a first transistor, a control electrode of the first transistor being coupled to the processor, and a second electrode of the first transistor being coupled to the first electrode of the light-emitting component;
    a first resistor, a first end of the first resistor being coupled to the first power supply voltage signal line;
    a comparator, a non-inverting input terminal of the comparator being coupled to an output terminal of the analog-to-digital converter, and an inverting input terminal of the comparator being coupled to a second end of the first resistor; and
    a second transistor, a control electrode of the second transistor being coupled to an output terminal of the comparator, a first electrode of the second transistor being coupled to the second end of the first resistor, and a second electrode of the second transistor being coupled to a first electrode of the first transistor.

4. The light-emitting substrate according to claim 1, wherein the light-emitting substrate comprises: a first control chip including the first control circuit; wherein
    the first control chip further includes:
    a first interface coupled to the processor in the first control circuit, the first interface being configured to receive the first light-emission signal, and transmit the first light-emission signal to the processor;
    a second interface coupled to the analog-to-digital converter in the first control circuit, the second interface being configured to receive the first enable signal, and transmit the first enable signal to the analog-to-digital converter;
    a third interface coupled to the first power supply voltage signal line and the first output sub-circuit in the first control circuit, the third interface being configured to receive the first power supply voltage signal from the first power supply voltage signal line, and transmit the first power supply voltage signal to the first output sub-circuit; and
    a fourth interface coupled to the first output sub-circuit in the first control circuit and the first electrode of the light-emitting component, the fourth interface being configured to transmit the first power supply voltage signal transmitted through the first output sub-circuit to the first electrode of the light-emitting component.

5. The light-emitting substrate according to claim 1, further comprising:
    a second control circuit disposed on the base, wherein the second control circuit is coupled to the plurality of first control circuits; and
    the second control circuit is configured to receive a driving signal, and transmit a first light-emission signal and a first enable signal to each of the first control circuits according to the driving signal.

6. The light-emitting substrate according to claim 5, wherein the second control circuit includes:
    a timing control sub-circuit configured to generate a clock signal;
    a data processing sub-circuit coupled to the timing control sub-circuit and the plurality of first control circuits; wherein the data processing sub-circuit is configured to receive the driving signal, and output a second enable signal according to the driving signal and the clock signal from the timing control sub-circuit, and transmit the first light-emission signal to the plurality of first control circuits;

a memory configured to store a timing data and a light-emission current data for a preset light-emission mode; and an amplifier sub-circuit coupled to the data processing sub-circuit, the memory and the plurality of first control circuits; wherein the amplifier sub-circuit is configured to amplify a power of the second enable signal from the data processing sub-circuit according to the timing data and the light-emission current data for the preset light-emission mode, and generate the first enable signal and transmit the first enable signal to the plurality of first control circuits.

7. The light-emitting substrate according to claim 6, wherein the light-emitting substrate comprises: a second control chip including the second control circuit; wherein the second control chip further includes:

a plurality of enable signal interfaces, the plurality of enable signal interfaces being coupled to the amplifier sub-circuit in the second control circuit and each of the enable signal interfaces being coupled to at least one of the first control circuits; and the enable signal interfaces being configured to receive the first enable signal from the amplifier sub-circuit, and transmit the first enable signal to the first control circuit coupled thereto;

a plurality of light-emission signal interfaces, the plurality of light-emission signal interfaces being coupled to the data processing sub-circuit in the second control circuit, and each of the light-emission signal interfaces is coupled to one of the first control circuits; and the light-emission signal interfaces being configured to receive the first light-emission signal from the data processing sub-circuit, and transmit the first light-emission signal to the first control circuit coupled thereto; and a driving signal interface, the driving signal interface being coupled to the data processing sub-circuit; and the driving signal interface being configured to receive the driving signal and transmit the driving signal to the data processing sub-circuit.

8. The light-emitting substrate according to claim 7, wherein the plurality of first control circuits are arranged in an array, and each of the enable signal interfaces is coupled to a row or a column of the first control circuits.

9. The light-emitting substrate according to claim 1, further comprising:

a plurality of second power supply voltage signal lines disposed on the base and arranged at intervals; wherein second electrodes of the light-emitting components in at least two light-emitting areas are coupled to one second power supply voltage signal line.

10. The light-emitting substrate according to claim 9, wherein the plurality of light-emitting areas are arranged in an array, and the light-emitting components in a same row or a same column of the light-emitting areas are coupled to one of the second power supply voltage signal lines.

11. The light-emitting substrate according to claim 9, wherein the first power supply voltage signal line and the second power supply voltage signal line both extend in a column direction, or both extend in a row direction.

12. The light-emitting substrate according to claim 11, wherein the second power supply voltage signal line and the first power supply voltage signal line are of a same material and are disposed in a same layer.

13. The light-emitting substrate according to claim 9, further comprising:

an insulating layer; wherein in a direction perpendicular to the base, the first power supply voltage signal line and the second power supply voltage signal line are located on a side, proximate to the base, of the insulating layer, and the light-emitting component and the first control circuit are located on a side, away from the base, of the insulating layer; and the insulating layer is provided with a first via and a second via, the first control circuit is coupled to the first power supply voltage signal line through the first via, and the second electrode of the light-emitting component is coupled to the second power supply voltage signal line through the second via.

14. The light-emitting substrate according to claim 13, wherein the light-emitting substrate further comprises a second control circuit, the light-emitting substrate further comprises:

a plurality of connecting leads disposed on the side, away from the base, of the insulating layer, the plurality of connecting leads being configured to couple respective first control circuits with the second control circuits.

15. A light-emitting module, comprising:
the light-emitting substrate according to claim 9;
a flexible circuit board; and
a power supply chip, the power supply chip being bonded to the light-emitting substrate through the flexible circuit board; and the power supply chip being configured to transmit the first power supply voltage signal to the first power supply voltage signal line, and transmit a second power supply voltage signal to the second power supply voltage signal line.

16. A display apparatus, comprising:
the light-emitting module according to claim 15, wherein the light-emitting substrate in the light-emitting module includes the plurality of first control circuits and a second control circuit; and
a driving chip coupled to the second control circuit, the driving chip being configured to transmit a driving signal to the second control circuit.

17. The light-emitting substrate according to claim 1, wherein the light-emitting component includes:
a plurality of light-emitting devices arranged in an array; and
a plurality of conductive patterns sequentially connected in series by the plurality of light-emitting devices; wherein
in a line formed by the plurality of light-emitting devices that are sequentially connected in series, a cathode of one of two light-emitting devices at both ends of the line is the first electrode of the light-emitting component, and an anode of another one of the two light-emitting devices is a second electrode of the light-emitting component.

18. A method for driving a light-emitting substrate, wherein the light-emitting substrate has a plurality of light-emitting areas, and the light-emitting substrate includes:
a base;
a plurality of light-emitting components disposed on the base, wherein one light-emitting component is located within one light-emitting area;
a plurality of first power supply voltage signal lines disposed on the base and arranged at intervals;
a plurality of first control circuits disposed on the base, wherein each of the first control circuits is coupled to a first electrode of one light-emitting component, and each of first power supply voltage signal lines is coupled to at least two first control circuits; and a second control circuit disposed on the base, wherein the second control circuit is coupled to the plurality of first control circuits; and the method for driving the light-emitting substrate comprises:

receiving, by the second control circuit, a driving signal, and transmitting, by the second control circuit, a first light-emission signal and a first enable signal to each of the first control circuits according to the driving signal; and transmitting, by the first control circuit, the first power supply voltage signal from the first power supply voltage signal line to the first electrode of the light-emitting component coupled to the first control circuit according to the first light-emission signal and the first enable signal to control the amplitude of the current flowing through the light-emitting component.

* * * * *